(12) United States Patent
Kimura

(10) Patent No.: US 6,828,725 B2
(45) Date of Patent: Dec. 7, 2004

(54) LIGHT EMITTING DEVICE

(75) Inventor: Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/056,382

(22) Filed: Jan. 25, 2002

(65) Prior Publication Data

US 2002/0101152 A1 Aug. 1, 2002

(30) Foreign Application Priority Data

Jan. 30, 2001 (JP) ........................................ 2001-022486

(51) Int. Cl.[7] ............................ H01J 63/04; H01J 1/62
(52) U.S. Cl. ..................................................... 313/505
(58) Field of Search ............................. 313/504–507, 313/498, 499, 113

(56) References Cited

U.S. PATENT DOCUMENTS 6,157,356 A * 12/2000 Troutman .................... 345/82
6,384,427 B1 * 5/2002 Yamazaki et al. ........... 257/59
6,417,521 B2 * 7/2002 Inukai ......................... 257/59
2002/0050795 A1 5/2002 Imura

FOREIGN PATENT DOCUMENTS

JP 2002-132186 5/2002

OTHER PUBLICATIONS

Q1, G. et al, "High–External–Quantum–Efficiency Organic Light–Emitting Devices," Optics Letters, vol. 22, No. 6, pp. 396–398, Mar. 15, 1997.
JP 2002–132186 English abstract.

* cited by examiner

Primary Examiner—Ashok Patel
Assistant Examiner—Sumati Krishnan
(74) Attorney, Agent, or Firm—Cook, Alex, McFarron, Manzo, Cummings & Mehler, Ltd.

(57) ABSTRACT

A light emitting device having a light emitting element is provided in which total reflection at the interface between a substrate and the air is avoided and all of emitted light can be taken out. The light emitting device of the present invention is provided with a light reflector. Therefore light emitted from an organic compound layer, which otherwise would meet total reflection at the interface between the substrate and the air, is reflected by the light reflector so that the light can reach outside.

57 Claims, 29 Drawing Sheets

θ a: exit angle of the light emitted form organic compound layer 202

θ b: taper angle of light reflector 220

θ c: incident angle of the light relected at the light reflector 220 with respect to the interface between the substrate 208 and air 209

$\theta e = \theta a - \theta b$ $\theta c = \theta b - \theta e$ $\underline{\theta c = 2\theta b - \theta a}$ $L/D = \tan\theta a$ $L/D < \tan 41° = 0.869$ $L/D < \tan\theta f$

LIGHT EMITTING DEVICE

BACKGROUND OF THE INVENTION

1. Field of the Invention

The present invention relates to a light emitting panel in which a light emitting element formed on an insulating surface is sealed between a substrate and a cover member. The invention also relates to a light emitting module obtained by mounting a driving circuit to the light emitting panel. 'Light emitting device' is herein the generic term for the light emitting panel and for the light emitting module. Specifically, the present invention relates to improving efficiency in taking out light from a light emitting element.

2. Description of the Related Art

In recent years, the technique of forming TFTs on a substrate has made a great advance and application of TFTs to active matrix display devices (light emitting devices) is being developed. TFTs formed of polysilicon films, in particular, have higher field effect mobility (also referred to as mobility) than conventional TFTs that use amorphous silicon films and accordingly can operate at high speed. Therefore pixels now can be controlled by a driving circuit formed on the same substrate on which the pixels are formed instead of a driving circuit external to the substrate as in the past.

Thus having various circuits and elements formed on the same substrate, an active matrix light emitting device provides a lot of advantages including reduction of manufacture cost, reduction in size of electro-optical device, raise in yield, and improvement of throughput.

An active matrix light emitting device using a light emitting element as a self-luminous element is particularly actively researched.

In this specification, a light emitting element has an organic compound layer sandwiched between a pair of electrodes (an anode and a cathode). The organic compound layer may take a laminate structure. As an example, a laminate structure consisting of a hole transporting layer, an organic compound layer, and an electron transporting layer can be given. The term organic compound layer in this specification includes layers for carrier injection, layers for carrier transportation, and layers for carrier recombination all. Luminescence obtained from an organic compound layer is classified into light emission upon return to the base state from singlet excitation (fluorescence) and light emission upon return to the base state from triplet excitation (phosphorescence). The present invention is applicable to a light emitting device using fluorescence and a light emitting device using phosphorescence both.

Heat, light, moisture, oxygen, and the like accelerate degradation of an organic compound layer of a light emitting element. For that reason, in general, a light emitting element is formed after a wiring line and a TFT are formed in a pixel portion in manufacturing an active matrix light emitting device.

After the light emitting element is formed, the substrate on which the light emitting element is formed is bonded to a cover member and sealed (packaged) using a seal member or the like so as not to expose the light emitting element to the outside air.

Once the airtightness is enhanced by packaging or other processing, a connector (FPC, TAB, or the like) is attached to connect a terminal led out of the light emitting element or a circuit formed on the substrate to an external signal terminal. The active matrix light emitting device is thus completed.

Now, a description is given on refraction of light with reference to FIG. 15. As shown in FIG. 15, the angle of refraction of light is determined by the angle of incident light (angle of incident) and index of refraction of the medium thereof. This relation follows Mathematical Expression 1 (Snell's Law) below. When light (incident light) enters, at an angle of $\theta_1$, a medium 801 having an index of refraction of $n_1$ and exits a medium 802 having an index of refraction of $n_2$, the light (refracted light) has an angle of $\theta_2$ satisfying the Expression 1 below.

Mathematical Expression 1

$$n_1 * \sin \theta_1 = n_2 * \sin \theta_2 \tag{1}$$

The angle of incident $\theta_1$ that makes the angle $\theta_2$ of the refracted light or transmitted light 90° is called a critical angle. When the angle of incident $\theta_1$ to the medium 802 is larger than the critical angle, the incident light is totally reflected. In other words, the light is trapped in the medium 801.

FIG. 16 shows the relation between angle of incident and reflectance when the medium 801 is glass ($n_1=1.52$) and the medium 802 is air ($n_2=1.00$).

As can be seen in FIG. 16, the reflectance sharply rises once the angle of incident to the interface reaches 35° or larger. When the angle of incident to the interface is 41° or larger, the light is totally reflected and cannot reach outside of the glass that is the medium 801.

A critical angle refers to the minimum angle at which total reflection of light at the interface between a medium 1 and a medium 2 takes place, and any angle larger than the critical angle causes total reflection. The magnitude of critical angle varies between media. For example, the critical angle is 41° when the medium 801 is glass and the medium 802 is air whereas it is 42.2° if the medium 801 is acrylic and the medium 802 is air.

Next, reference is made to FIG. 17. Reference numeral 202 denotes an organic compound layer. An arrow starting from the organic compound layer 202 shown in FIG. 17 indicates a direction in which light emitted from the organic compound layer 202 travels. The light emitted from the organic compound layer 202 is dispersed in every direction and enters the interface between the bottom face of a substrate 208 and air 209. Since light travels by nature toward a medium having higher index of refraction, only light that has a small angle of incident with respect to the interface between the substrate 208 and the air 209 can reach the air 209.

Assume here that the substrate 208 shown in FIG. 17 is a glass substrate (having an index of refraction of 1.52). Then, of the light emitted from the organic compound layer 202, one having an angle of incident of 35° or larger and 41.1° or smaller is reflected at the interface with abruptly increased reflectance. Furthermore, light having an angle of incident larger than 41.1° is totally reflected at the interface and therefore cannot be taken out the substrate 208. Accordingly, the efficiency is low in taking out light emitted from the organic compound layer 202 to the exterior.

To simplify the explanation, this specification focuses on light refracted or reflected at the interface between the substrate 208 and the air 209 while ignoring other light emitted from the organic compound layer 202, namely, one that is refracted or reflected at the interface of solid thin films such as a gate insulating film and an interlayer insulating film. In actuality, light is always totally reflected or refracted at the interface between different media. For example, the interface between a transparent electrode and an interlayer insulating film, or the interface between an interlayer insulating film and a gate insulating film causes total reflection or refraction of light. However, these are ignored in this specification.

SUMMARY OF THE INVENTION

The present invention has been made to solve the above problem, and an object of the present invention is therefore to provide a light emitting device in which light emitted from a light emitting element can be taken out efficiently.

The structure of a light emitting device according to the present invention will be described with reference to FIG. 1A. In FIG. 1A, an arrow started from an organic compound layer 202 represents light emitted from the organic compound layer 202.

In FIGS. 1A and 1B, reference numeral 201 denotes a transparent electrode (pixel electrode); 202, the organic compound layer; and 203, a cathode. An area in which the transparent electrode 201, the organic compound layer 202, and the cathode 203 overlap one another corresponds to a light emitting element 200. 220 denotes a light reflector. Denoted by 208 is a substrate having an insulating surface; 209, air; 205, a first interlayer insulating film; and 204, a second interlayer insulating film. 207 denotes a passivation film.

In the present invention, the light reflector 220 is formed near the organic compound layer 202 as shown in FIG. 1A. The light reflector 220 is slanted with respect to light the organic compound layer 202 emits vertically to the substrate 208. In this specification, the angle of the light reflector 220 with respect to light the organic compound layer 202 emits vertically to the substrate 208 is called a taper angle of the light reflector 220.

A light reflector defined herein is an object that has a function of reflecting light. Specifically, the term refers to an object that has a function of reflecting light that has been emitted from an organic compound layer and transmitted through a solid thin film.

Next, reference is made to FIG. 1B. FIG. 1B is an enlarged view of an area of FIG. 1A that is surrounded by the dotted line. To simplify the illustration, the transparent electrode 201 is omitted in FIG. 1B. Light emitted from the organic compound layer 202 at a large exit angle $\theta a$ abuts against the light reflector 220 to be reflected. Then the light enters the interface between the substrate 208 and the air 209 at an angle of incident $\theta c$. At this point, the angle of incident $\theta c$ is always smaller than the exit angle $\theta a$ because the light reflector 220 is slanted with respect to the substrate 208. As a result, light reflected at the light reflector 220 can reach the air 209.

The dotted line arrow of FIG. 1B shows the direction in which light travels when the light reflector 220 is not provided. Of light emitted from the organic compound layer 202, one that has a large exit angle $\theta a$ enters the interface between the substrate 208 and the air 209 at an angle of incident $\theta a$. In this case, the angle of incident $\theta a$ is equal to the exit, angle $\theta a$ and is large. Therefore the light is totally reflected at the interface between the substrate 208 and the air 209 and cannot reach the air 209.

Of light emitted from the organic compound layer 202, one that has a small exit angle $\theta a$ does not travel toward the light reflector 220 and therefore can reach the air 209 (outside) without being influenced by the light reflector 220.

As described above, the present invention uses the light reflector 220 to have light, which cannot reach the air 209 in prior art, reflected so as to reach the air 209. To elaborate, light emitted from the organic compound layer 202, which otherwise would meet total reflection at the interface between the substrate 208 and the air 209, is reflected at the light reflector 220 to thereby reach the air 209. The efficiency in taking out light emitted from the organic compound layer 202 thus can be improved.

The description given next with reference to FIG. 13 is about the taper angle of the light reflector provided in the light emitting device of the present invention. FIG. 13 is an enlarged view of an area of FIG. 1B that is surrounded by the dotted line, and shows a case in which light emitted from the organic compound layer 202 is reflected at the light reflector 220 to be taken out of the substrate 208.

In FIG. 13, $\theta a$ represents the exit angle of light emitted from the organic compound layer 202, whereas $\theta b$ represents the taper angle of the light reflector 220. The taper angle is an angle of the light reflector 220 with respect to light the organic compound layer 202 emits vertically to the substrate 208. $\theta c$ represents the angle of incident at which the light reflected by the light reflector 220 enters the interface between the substrate 208 and the air 209. An angle obtained by subtracting $\theta b$ from $\theta a$ is given as $\theta e$ in the following Mathematical Expression 2.

Mathematical Expression 2

$$\theta e = \theta a - \theta b \qquad (2)$$

$\theta c$ is equal to an angle obtained by subtracting $\theta e$ from $\theta b$ as shown in the following Mathematical Expression 3.

Mathematical Expression 3

$$\theta c = \theta b - \theta e \qquad (3)$$

From the above Mathematical Expressions 2 and 3, Mathematical Expression 4 showing the relation among $\theta a$, $\theta b$, and $\theta c$ can be obtained.

Mathematical Expression 4

$$\theta c = 2\theta b - \theta a \qquad (4)$$

When the substrate 208 is a glass substrate, the substrate 208 has an index of refraction of 1.52. Since the air 209 has an index of refraction of 1.0, the critical angle at the interface between the substrate 208 and the air 209 is 41° from the graph of FIG. 16. This means that light with $\theta a$ larger than 41° cannot be taken out of the substrate 208 unless the light reflector 220 is provided. Accordingly, only light with $\theta a$ equal to or larger than 41° is taken into consideration. With regard to $\theta c$, in order to take light reflected at the light reflector 220 out of the substrate 208, $\theta c$ has to satisfy the following Mathematical Expression 5.

Mathematical Expression 5

$$-41° < \theta c < 41° \qquad (5)$$

The following Mathematical Expression 6 can be obtained by substituting the Expression 4 for $\theta c$ in the Expression 5.

Mathematical Expression 6

$$-41° < 2\theta b - \theta a < 41° \qquad (6)$$

In the Expression 6 is rearranged to obtain the following Mathematical Expression 7.

Mathematical Expression 7

$$(-41° + \theta a)/2 < \theta b < (41° + \theta a)/2 \qquad (7)$$

In the case considered here, $\theta a$ is 41° or larger. Therefore, first, $\theta a$ in the Expression 7 is substituted by $\theta a = 41°$ to obtain the following Mathematical Expression 8.

Mathematical Expression 8

$$0° < \theta b < 41° \quad (8)$$

Next, θa in the Expression 7 is substituted by θa=42° to obtain the following Mathematical Expression 9.

Mathematical Expression 9

$$0.5° < \theta b < 41.5° \quad (9)$$

Next, θa in the Expression 7 is substituted by θa=60° to obtain the following Mathematical Expression 10.

Mathematical Expression 10

$$8.5° < \theta b < 50.5° \quad (10)$$

Next, θa in the Expression 7 is substituted by θa=90° to obtain the following Mathematical Expression 11.

Mathematical Expression 11

$$24.5° < \theta b < 65.5° \quad (11)$$

As described above, the range of θb varies depending on the value of θa. From the Expression 11, θb<65.5° when θa takes the maximum value (=90°). Accordingly, the maximum value of θb is 65.5°. In other words, there is no need to set θb to an angle larger than 65.5°.

When it is not necessary to set θb to an angle larger than 65.5°, the substrate 208 is a glass substrate. Next, the critical angle at the interface between the substrate 208 and the air 209 is given as θf and the maximum value for the taper angle θb of the light reflector 220 is obtained. The following Mathematical Expression 12 is obtained by substituting the critical angle θf for the critical angle in the Expression 7 above.

Mathematical Expression 12

$$(-\theta f + \theta a)/2 < \theta b < (\theta a + \theta f)/2 \quad (12)$$

Here, the maximum value of θa (=90°) substitutes θa in the Expression 12 to obtain the maximum value of θb.

Mathematical Expression 13

$$\theta b < (90° + \theta f)/2 \quad (13)$$

By rearranging the Expression 13, the following Mathematical Expression 14 can be obtained.

Mathematical Expression 14

$$\theta b < 45° + (\theta f / 2) \quad (14)$$

In conclusion, the taper angle of the light reflector 220 preferably set to satisfy the Expression 14.

DETAILED DESCRIPTION OF THE PREFERRED EMBODIEMNTS

Embodiment Mode 1

Figure 1B:
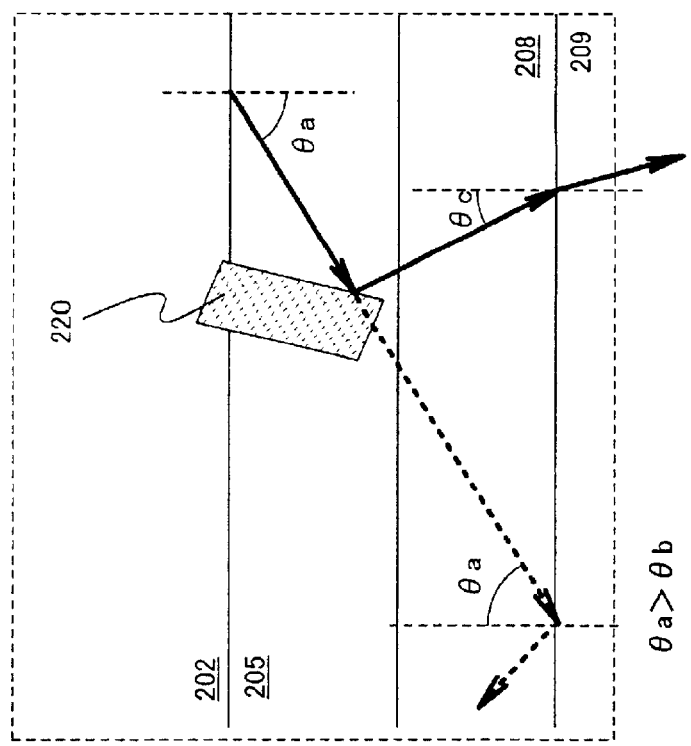
FIGS. 1A and 1B are sectional views of a pixel in a light emitting device of the present invention.
Figure 1A:
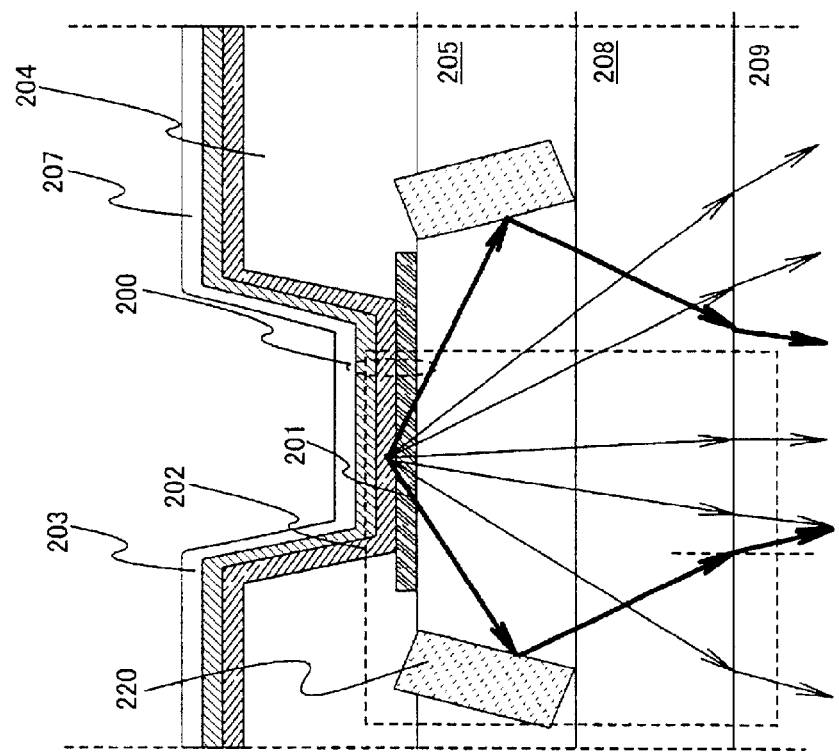
Figure 2:
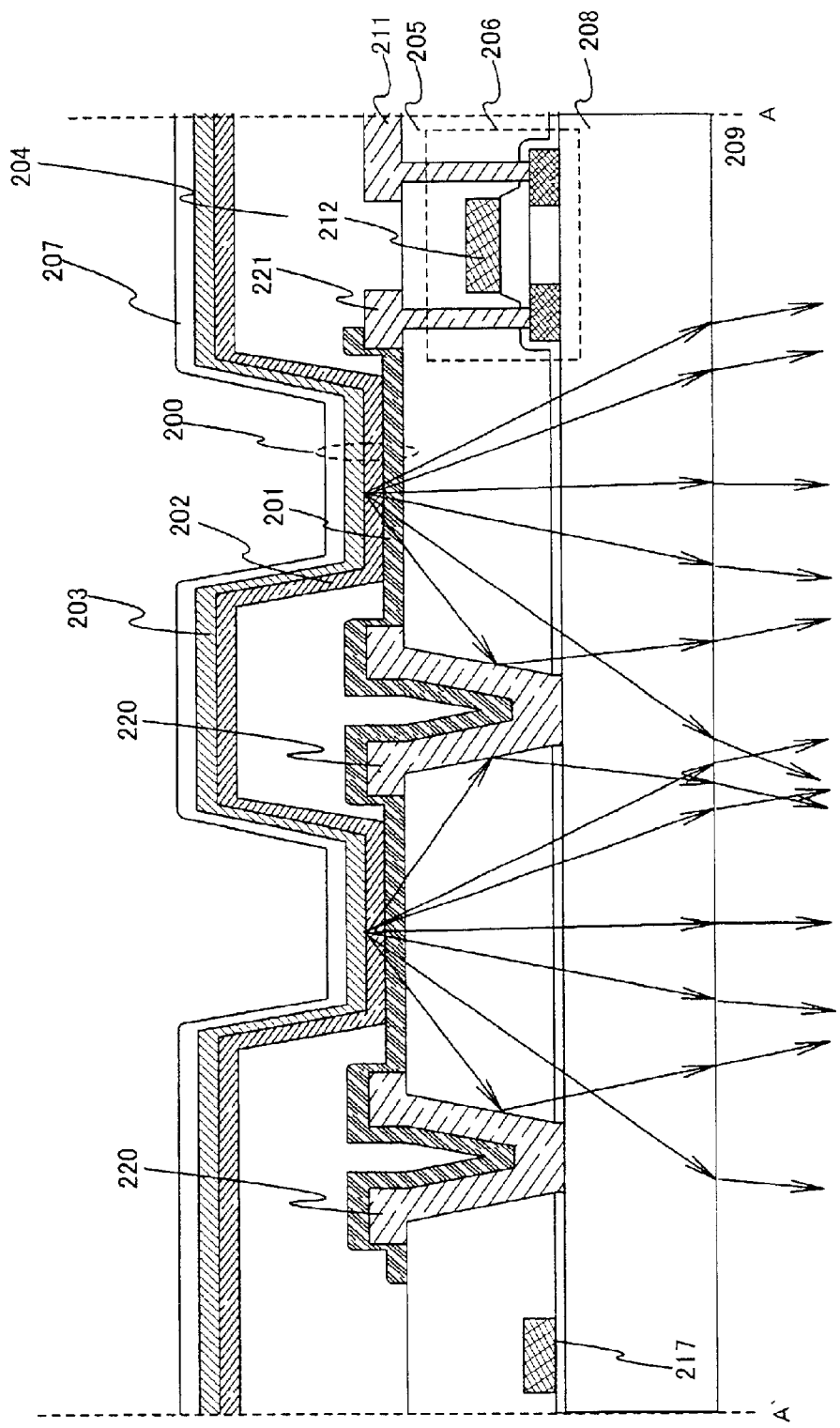
FIG. 2 is a sectional view of a pixel in a light emitting device of the present invention.
Figure 3:
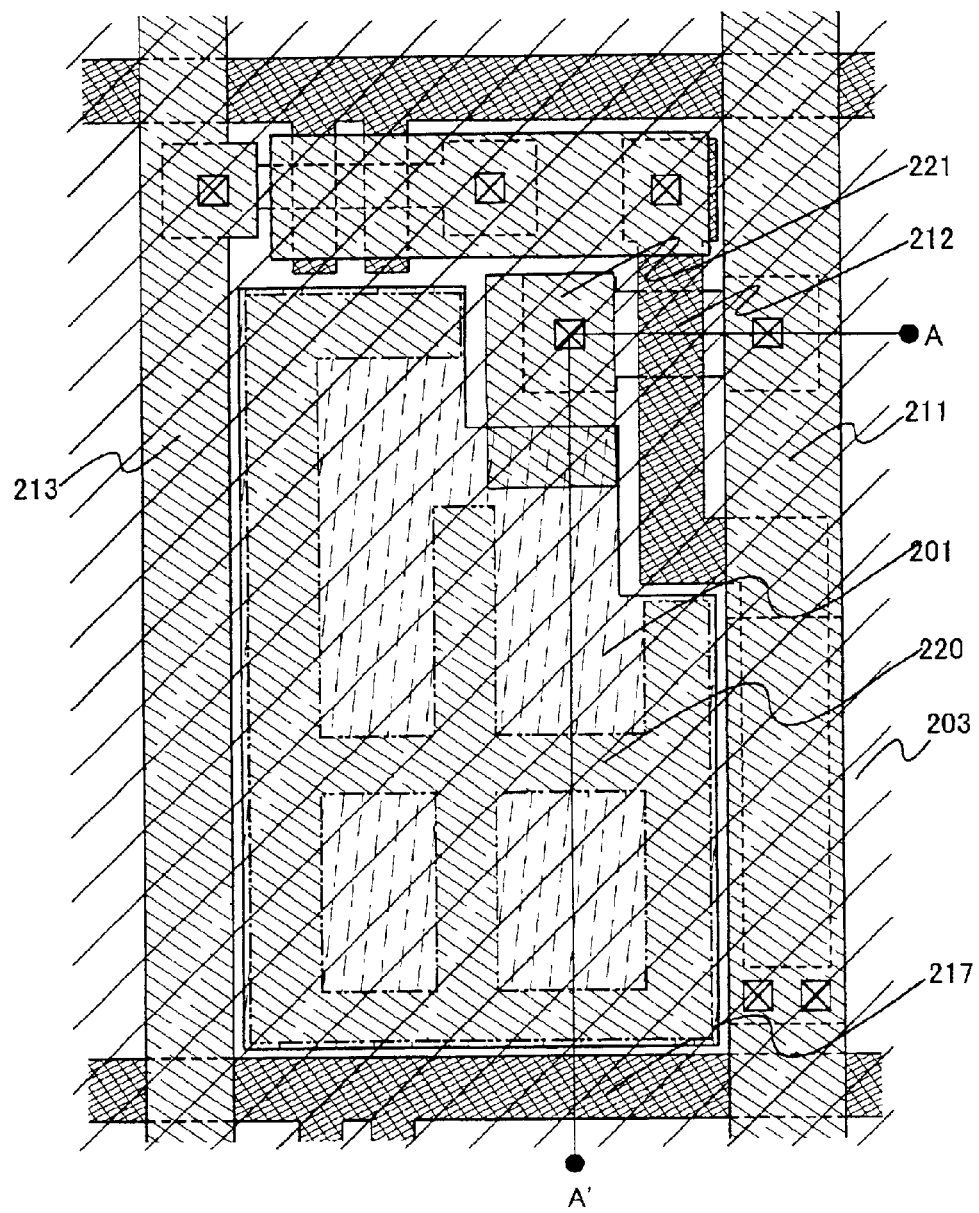
FIG. 3 is a top view of a pixel in a light emitting device of the present invention.

This embodiment mode describes an example of forming a hole (contact hole) in a first insulating film that is in contact with a TFT and then forming a light reflector so as to cover the hole. The description is given with reference to FIGS. 2 and 3. FIG. 2 is a diagram showing a sectional structure of a light emitting device according to this embodiment mode, and FIG. 3 is a top view showing one pixel. FIG. 2 is the sectional view taken along the line A–A' in FIG. 3. In FIGS. 2 and 3, the same components are denoted by the same symbols for cross reference.

Reference symbol 201 in FIG. 2 denotes a transparent electrode (anode) formed of a transparent metal material. An indium tin oxide (ITO) film or a transparent conductive film obtained by mixing indium oxide with 2 to 20% of zinc oxide (ZnO) can be used for the transparent electrode (anode). Also suitable as the transparent electrode is a conductive oxide film such as a zinc oxide film doped with gallium (Ga) (ZnO: Ga) to enhance the transmissivity of visible light or the conductivity.

Reference symbol 202 denotes an organic compound layer and 203, a cathode. The cathode 203 can be formed from a known material such as MgAg and LiF/Al. In the organic compound layer 202 of a light emitting element 200, recombination of electrons injected from the cathode 203 and holes injected from the anode takes place to cause the light emitting element to emit light. A passivation film 207 serving as a protective film is formed on the cathode 203.

A thin film transistor (TFT) is formed on a substrate 208 that has an insulating surface. In this specification, a thin film transistor (TFT) refers to an element composed of a semiconductor film, a gate insulating film that is in contact with the semiconductor film, and a gate electrode that is in contact with the gate insulating film.

The TFT shown in FIG. 2 is a current controlling TFT 206 that is electrically connected to the transparent electrode 201 formed in the pixel. A light reflector, air, a first interlayer insulating film, and a second interlayer insulating film are denoted by 220, 209, 205, and 204, respectively. A power supply line, a gate electrode, a connection wiring line, and a source line are denoted by 211, 212, 221, and 213, respectively.

In a manufacture process according to this embodiment mode, the gate electrode 212 of the current controlling TFT 206 and a gate line 217 are simultaneously formed on the substrate 208 having an insulating surface. Thereafter, the first interlayer insulating film 205 is formed so as to cover the current controlling TFT 206 and the gate line 217. Holes (contact holes) for forming the power supply line 211, the connection wiring line 221, and the light reflector 220 are then formed in the first interlayer insulating film 205. Although the holes for forming the light reflectors formed so as to penetrate the first interlayer insulating film 205 in FIG. 2, these holes may be formed so as not to penetrate entirely the first interlayer insulating film 205.

The power supply line 211 is formed to be connected to the current controlling TFT 206 through the hole (contact hole) formed in the first interlayer insulating film 205. The connection wiring line 221 is formed to be connected to the current controlling TFT 206 through the hole (contact hole) formed in the first interlayer insulating film 205. The power supply line 211 and the connection wiring line 221 are formed at the same time the light reflector 220 is formed. Accordingly, it is preferable to use the same material to form the power supply line 211, the connection wiring line 221, and the light reflector 220. However, the present invention is not limited thereto and the power supply line 211, the connection wiring line 221, and the light reflector 220 may be formed separately from different materials.

The transparent electrode 201 is formed so as to cover the first interlayer insulating film 205. At this point, the transparent electrode 201 is electrically connected to the connection wiring line 221.

The second interlayer insulating film 204 is formed next on the first interlayer insulating film 205 so as to cover the transparent electrode 201, the connection wiring line 221, and the power supply line 211. Thereafter the second interlayer insulating film 204 is partially etched to expose the transparent electrode 201.

The organic compound layer 202, the cathode 203, and the passivation film 207 are laid in this order while covering the transparent electrode 201 and the second interlayer insulating film 204. An area in which the transparent electrode 201, the organic compound layer 202, and the cathode 203 overlap one another corresponds to a light emitting element 200.

A material having high reflectance is preferably used for the light reflector 220. Specifically, a suitable material is one that has 60% or higher, preferably 80% or higher, reflectance with respect to light in the visible light range. Examples of such material include Ag, Al, Ta, Nb, Mo, Cu, Mg, Ni, and Pb.

The polarity of the current controlling TFT 206 may either be n channel type or p channel type. However, p channel type is preferred here since the transparent electrode 201 in FIG. 2 serves as an anode.

An arrow started from the organic compound layer 202 in FIG. 2 indicates a direction light emitted from the organic compound layer 202 travels. Of light emitted from the organic compound layer 202, one that has a large exit angle is reflected at the light reflector 220 to reach the air 209.

Although the transparent electrode 201 is formed so as to cover the light reflector 220 in FIGS. 2 and 3, the present invention is not limited thereto. The transparent electrode 201 may not always cover the light reflector 220. The light reflector 220 in FIGS. 2 and 3 is not connected to the source line 213 and the power supply line 211, but it may be connected to these lines. In that case, the light reflector 220 must not be electrically connected to the transparent electrode 201 in order to avoid short circuit of current flowing in the pixel.

In FIG. 3, the area for forming the light reflector 220, which is to cover the hole (contact hole), is merely indicated by the dotted line instead of marking the hole (contact hole) for clearer view. The area of the pixel where the light reflector 220 is to be formed is not particularly limited and can be determined at designer's discretion.

Figure 4A:
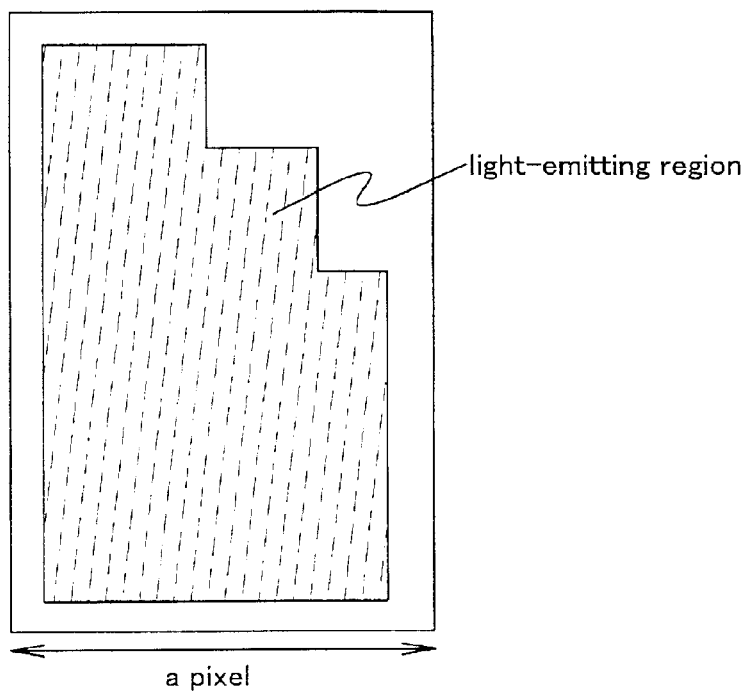
FIGS. 4A and 4B are diagrams showing the structure of a light emitting device of the present invention.
Figure 4B:
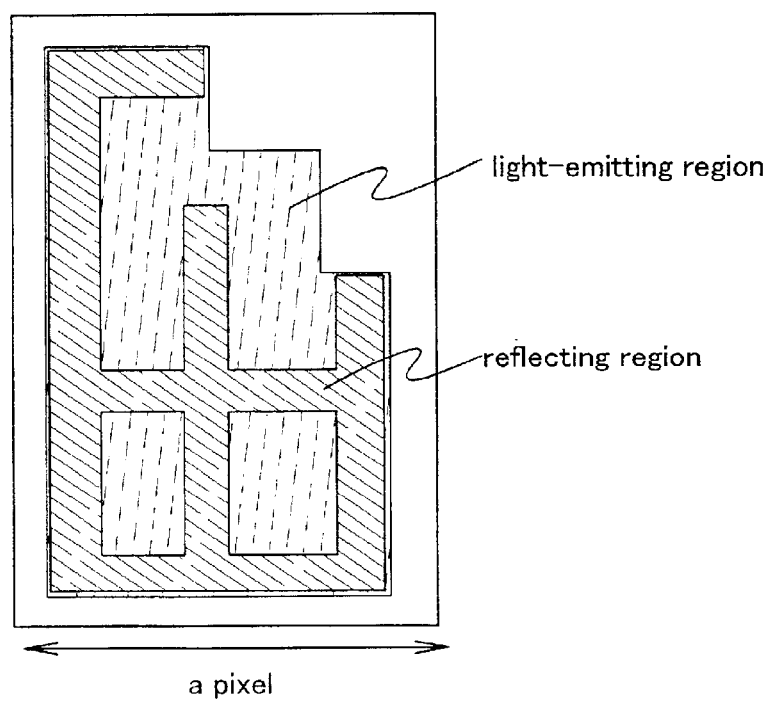

FIGS. 4A and 4B are diagrams showing a light emission region and a reflection region of the one pixel illustrated in FIGS. 2 and 3 in accordance with this embodiment mode. Here, the light emission region means the region in which the light emitting element 200 is formed whereas the reflection region means the region in which the light reflector 220 is formed. FIG. 4A shows a case where no light reflector is provided and the pixel in FIG. 4A has a light emission region alone. FIG. 4B shows a case where the light reflector 220 of the present invention is provided and the pixel in FIG. 4B has a light emission region and a reflection region both.

As shown in FIG. 4B, the light reflector 220 makes it possible to take light the organic compound layer 202 emits, which otherwise would be totally reflected at the interface between the substrate 208 and the air 209 and could not reach outside, out of the substrate 208 through the reflection region. The efficiency in taking out light emitted from the organic compound layer 202 thus can be improved.

Embodiment Mode 2

Figure 5:
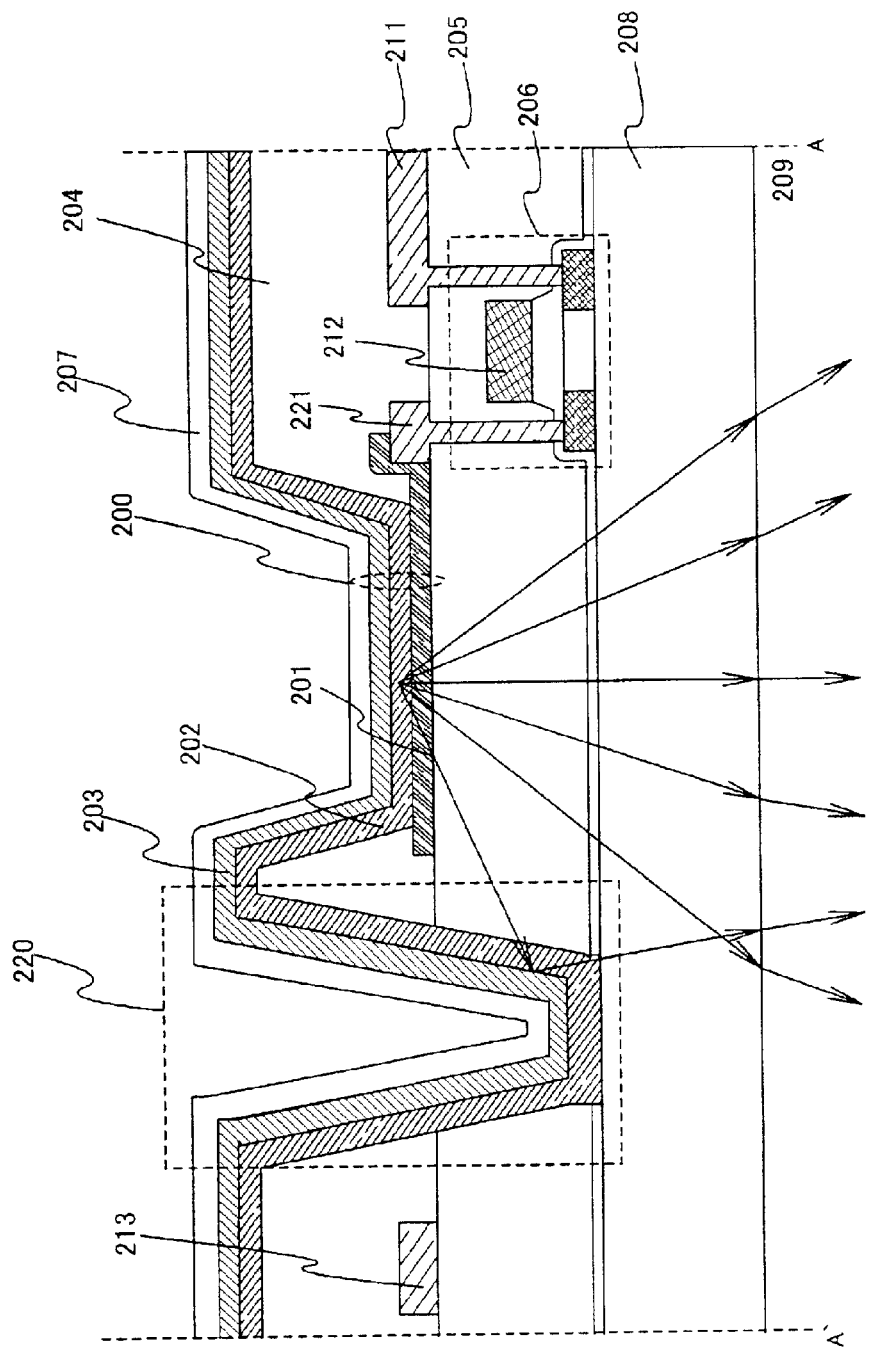
FIG. 5 is a sectional view of a pixel in a light emitting device of the present invention.
Figure 6:
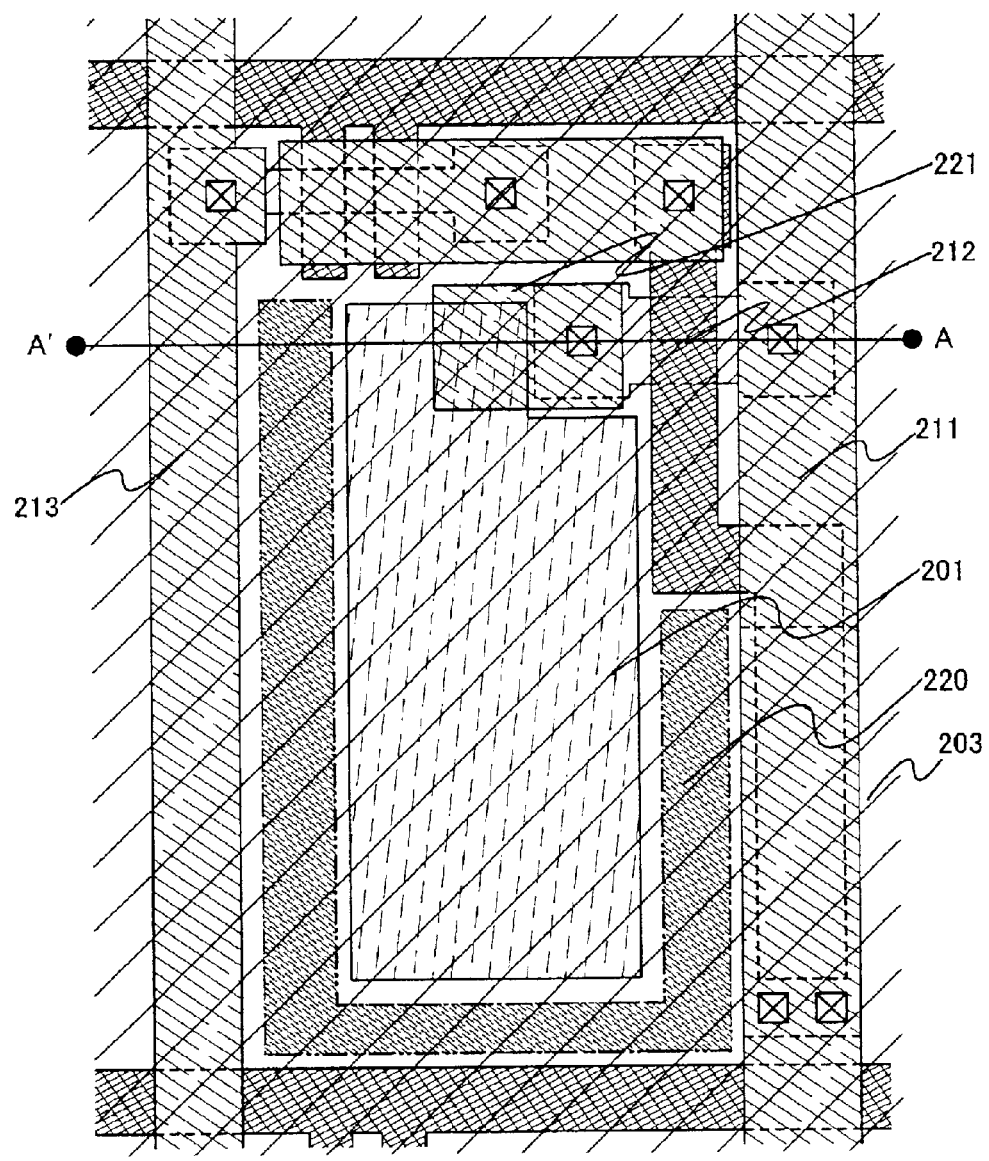
FIG. 6 is a top view of a pixel in a light emitting device of the present invention.

This embodiment mode describes a light emitting device obtained by forming a hole (contact hole) in a first insulating film that is in contact with a TFT and then forming a cathode of a light emitting element so as to cover the hole. The description is given with reference to FIGS. 5 and 6. FIG. 5 is a diagram showing a sectional structure of the light emitting device, and FIG. 6 is a top view showing one pixel. FIG. 5 is the sectional view taken along the line A–A' in FIG. 6. In FIGS. 5 and 6, the same components are denoted by the same symbols for cross reference.

Reference symbol 201 in FIG. 5 denotes a transparent electrode, 202, an organic compound layer and 203, a cathode. An area in which the transparent electrode 201, the organic compound layer 202, and the cathode 203 overlap one another corresponds to a light emitting element 200. 220 denotes a light reflector. A current controlling TFT 206 is formed on a substrate 208 having an insulating surface. Denoted by 209 is air, 205, a first interlayer insulating film, 204, a second interlayer insulating film, and 207, a passivation film. A power supply line, a gate electrode, a connection wiring line, and a source line are denoted by 211, 212, 221, and 213, respectively.

In a manufacture process according to this embodiment mode, the gate electrode 212 of the current controlling TFT 206 is formed on the substrate 208 having an insulating surface. Thereafter, the first interlayer insulating film 205 is formed so as to cover the current controlling TFT 206 and a gate line. Holes (contact holes) for forming the power supply line 211, the connection wiring line 221, and the light reflector 220 are then formed in the first interlayer insulating film 205.

The power supply line 211 is formed to be connected to the current controlling TFT 206 through the hole formed in the first interlayer insulating film 205. The connection wiring line 221 is formed to be connected to the current controlling TFT 206 through the hole formed in the first interlayer insulating film 205. The power supply line 211, the connection wiring line 221, and the source line 213 are formed simultaneously. Accordingly, it is preferable to use the same material to form the power supply line 211, the connection wiring line 221, and the source line 213.

The transparent electrode 201 is formed so as to cover the first interlayer insulating film 205. At this point, the transparent electrode 201 is electrically connected to the connection wiring line 221. When the transparent electrode 201 is formed, a resist mask or the like is used to cover the hole for forming the light reflector 220 in order to avoid forming the transparent electrode on the hole.

The second interlayer insulating film 204 is formed next on the first interlayer insulating film 205 so as to cover the transparent electrode 201, the connection wiring line 221, and the power supply line 211. Thereafter the second interlayer insulating film 204 is partially etched to expose the transparent electrode 201.

The organic compound layer 202, the cathode 203, and the passivation film 207 are laid in this order while covering the transparent electrode 201 and the second interlayer insulating film 204. When laying the organic compound layer 202, the cathode 203, and the passivation film 207 in order, the hole for forming the light reflector 220 is also covered. The area in which the transparent electrode 201, the organic compound layer 202, and the cathode 203 overlap one another corresponds to the light emitting element 200.

The polarity of the current controlling TFT 206 may either be n channel type or p channel type. However, p channel type is preferred here since the transparent electrode 201 in FIG. 5 serves as an anode.

An arrow started from the organic compound layer 202 in FIG. 5 indicates a direction light emitted from the organic compound layer 202 travels. Of light emitted from the organic compound layer 202, one that has a large exit angle is reflected at the light reflector 220 to reach outside of the substrate 208 since the light reflector 220 is slanted with respect to the substrate 208.

In FIG. 5, the organic compound layer 202 is formed to come into contact with the first interlayer insulating film 205 in the hole (contact hole) for forming the light reflector 220, then the cathode 203 is formed on the organic compound layer 202, and then the passivation film 207 is formed on the cathode 203. However, the present invention is not limited thereto. Light emitted from the organic compound layer 202 is reflected by the cathode 203. Therefore the cathode 203 alone may cover the hole.

In FIG. 6, the area for forming the light reflector 220, which is to cover the hole, is merely indicated by the dotted line instead of marking the hole for clearer view. The area of the pixel where the light reflector 220 is to be formed is not particularly limited and can be determined at designer's discretion.

This embodiment mode may be combined freely with Embodiment Mode 1.

Embodiment Mode 3

Figure 7:
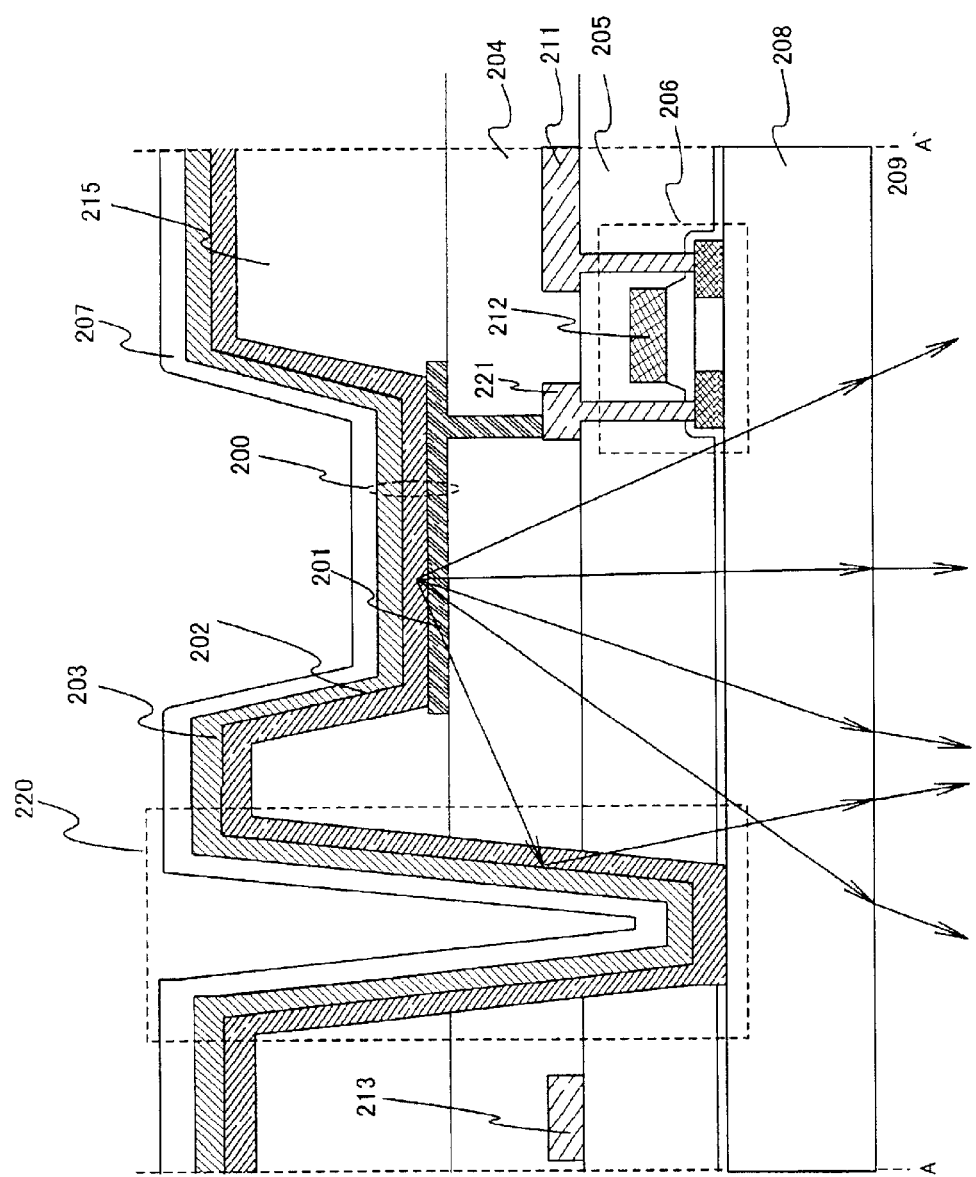
FIG. 7 is a sectional view of a pixel in a light emitting device of the present invention.
Figure 8:
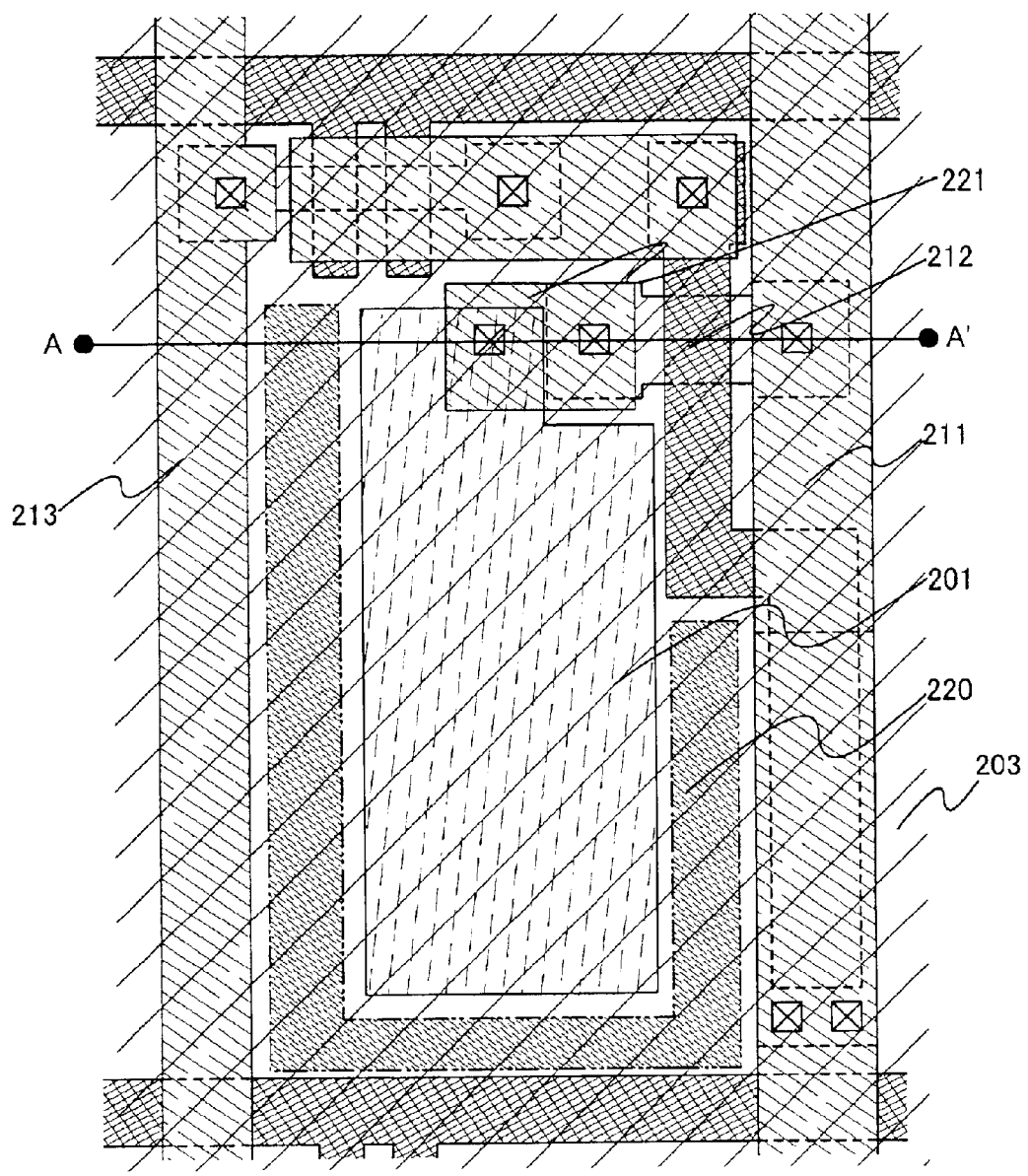
FIG. 8 is a top view of a pixel in a light emitting device of the present invention.

This embodiment mode describes an example of using a cathode of a light emitting device as a light reflector, which is different from the example in Embodiment Mode 2. FIG. 7 is a diagram showing a sectional structure of a light emitting device, and FIG. 8 is a top view showing one pixel. FIG. 7 is the sectional view taken along the line A–A' in FIG. 8. In FIGS. 7 and 8, the same components are denoted by the same symbols for cross reference.

Reference symbol 201 in FIG. 7 denotes a transparent electrode, 202, an organic compound layer and 203, a cathode. An area in which the transparent electrode 201, the organic compound layer 202, and the cathode 203 overlap one another corresponds to a light emitting element 200. 220 denotes a light reflector. A current controlling TFT 206 is formed on a substrate 208 having an insulating surface. Denoted by 209 is air, 205, a first interlayer insulating film, 204, a second interlayer insulating film, 215, a third interlayer insulating film, and 207, a passivation film. A power supply line, a gate electrode, a connection wiring line, and a source line are denoted by 211, 212, 221, and 213, respectively.

In a manufacture process according to this embodiment mode, the gate electrode 212 of the current controlling TFT 206 is formed on the substrate 208 having an insulating surface. Thereafter, the first interlayer insulating film 205 is formed so as to cover the current controlling TFT 206. Holes (contact holes) for forming the power supply line 211, the connection wiring line 221, and the light reflector 220 are then formed in the first interlayer insulating film 205.

The power supply line 211 is formed to be connected to the current controlling TFT 206 through the hole (contact hole) formed in the first interlayer insulating film 205. The connection wiring line 221 is formed to be connected to the current controlling TFT 206 through the hole formed in the first interlayer insulating film 205. The power supply line 211, the connection wiring line 221, and the source line 213 are formed simultaneously.

A second interlayer insulating film 204 is formed so as to cover the power supply line 211, the connection wiring line 221, and the source line 213. A hole is formed in the second interlayer insulating film 204 so that the transparent electrode 201 is electrically connected to the connection wiring line 221. A hole forming the light reflector 220 is formed at the same time.

The transparent electrode 201 is formed so as to cover the second interlayer insulating film 204. At this point, the transparent electrode 201 is electrically connected to the connection wiring line 221. When the transparent electrode 201 is formed, a resist mask or the like is used to cover the hole for forming the light reflector 220 in order to avoid forming the transparent electrode on the hole.

The third interlayer insulating film 215 is formed next on the second interlayer insulating film 204 so as to cover the transparent electrode 201. Thereafter the third interlayer insulating film 215 is partially etched to expose the transparent electrode 201.

The organic compound layer 202, the cathode 203, and the passivation film 207 are laid in this order while covering the transparent electrode 201 and the third interlayer insulating film 215. When laying the organic compound layer 202, the cathode 203, and the passivation film 207 in order, the hole for forming the light reflector 220 is also covered. The area in which the transparent electrode 201, the organic compound layer 202, and the cathode 203 overlap one another corresponds to the light emitting element 200.

The polarity of the current controlling TFT 206 may either be n channel type or p channel type. However, p channel type is preferred here since the transparent electrode 201 in FIG. 7 serves as an anode.

The hole for forming the light reflector 220 may be opened after the first interlayer insulating film 205 and then the second interlayer insulating film 204 are formed. Alternatively, the hole may be opened through two steps; a part of the hole is formed after the first interlayer insulating film 205 is formed and the rest of the hole is formed after the second interlayer insulating film 204 is formed.

An arrow started from the organic compound layer 202 in FIG. 7 indicates a direction light emitted from the organic compound layer 202 travels. Of light emitted from the organic compound layer 202, one that has a large exit angle is reflected at the light reflector 220 to reach outside of the substrate 208 since the light reflector 220 is slanted with respect to the substrate 208.

In FIG. 7, the organic compound layer 202 is formed to come into contact with the first interlayer insulating film 205 and the second interlayer insulating film 204 in the hole (contact hole) for forming the light reflector 220, then the cathode 203 is formed on the organic compound layer 202, and then the passivation film is formed on the cathode 203. However, the present invention is not limited thereto. Light emitted from the organic compound layer 202 is reflected by the cathode 203. Therefore the cathode 203 alone may cover the hole. A metal film may be formed on the hole for forming the light reflector. Then the organic compound layer and the cathode are formed on the metal film.

In FIG. 8, the area for forming the light reflector 220, which is to cover the hole, is merely indicated by the dotted line instead of marking the hole for clearer view. The area of the pixel where the light reflector 220 is to be formed is not particularly limited and can be determined at designer's discretion.

The cathode 203 is formed in the hole (contact hole) for forming the light reflector 220 in this embodiment mode. However, the present invention is not limited thereto and the same material that is used to form the power supply line 211 and the source line 213 may be employed. Then the light reflector 220 may not be connected to the source line 213 and the power supply line 211, or may be connected to these lines. In that case, the light reflector 220 must not be electrically connected to the transparent electrode 201 in order to avoid short circuit of current flowing in the pixel.

This embodiment mode may be combined freely with Embodiment Modes 1 and 2.

Embodiment Mode 4

Figure 9:
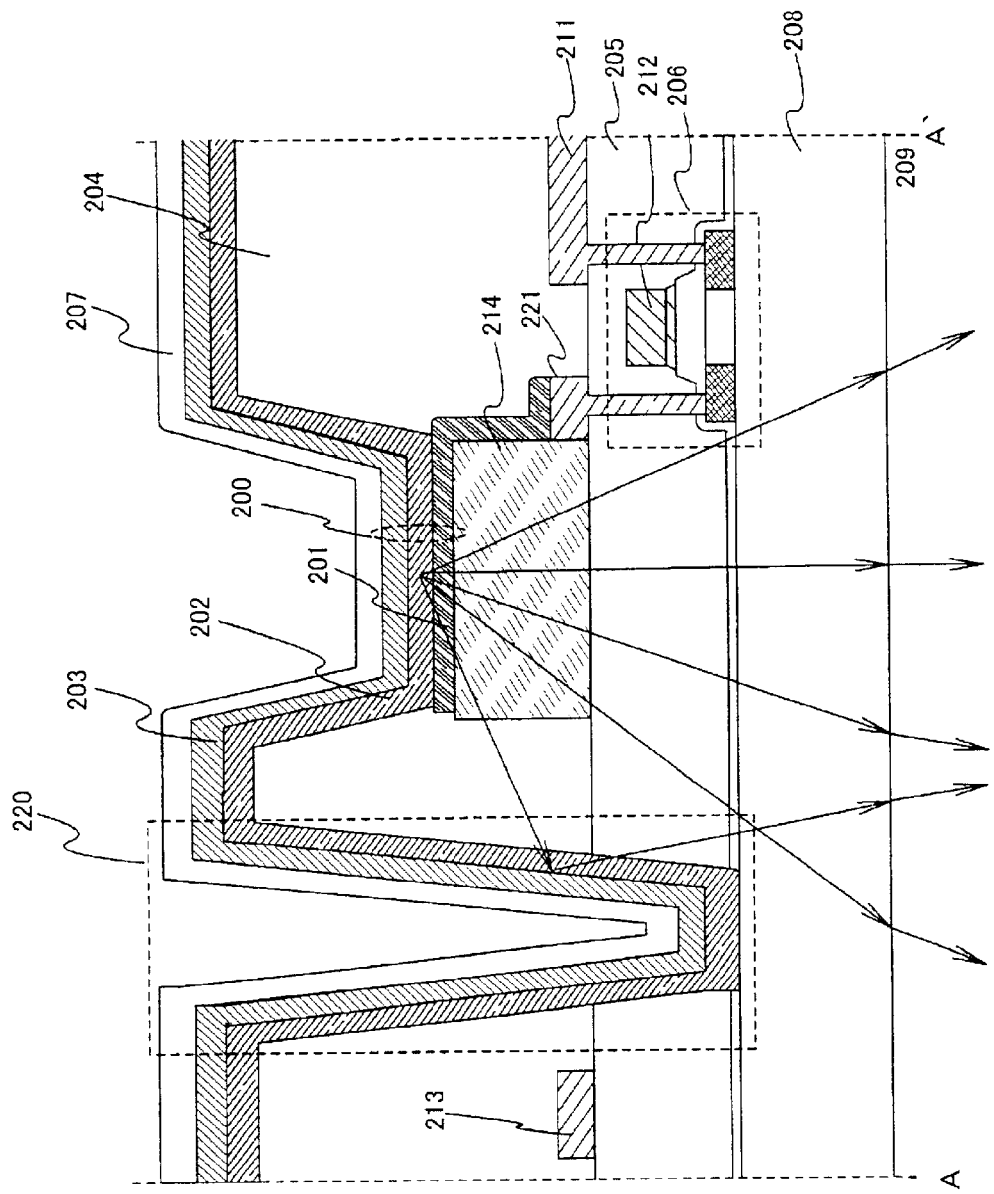
FIG. 9 is a sectional view of a pixel in a light emitting device of the present invention.
Figure 10:
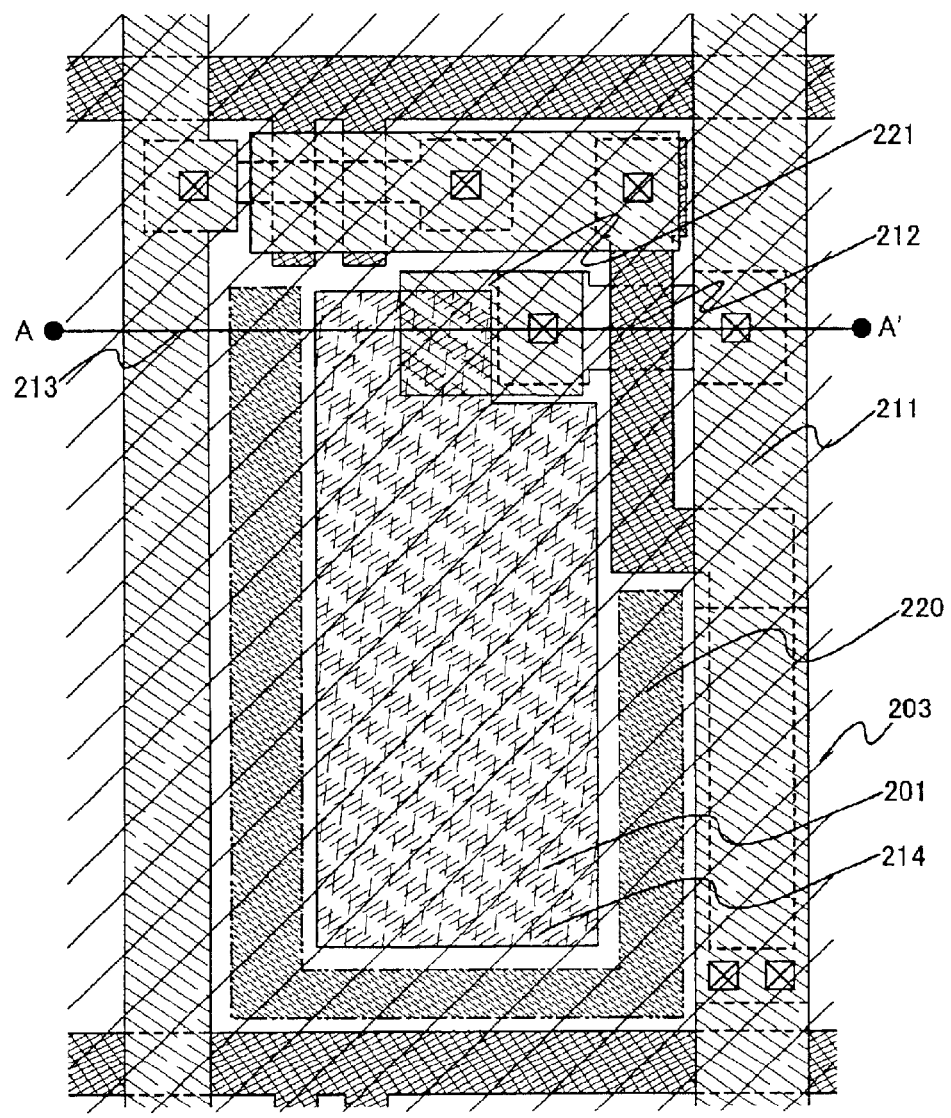
FIG. 10 is a top view of a pixel in a light emitting device of the present invention.

This embodiment mode describes an example of using as a light reflector a cathode of a light emitting element, which is different from the examples in Embodiment Modes 2 and 3. The description is given with reference to FIGS. 9 and 10. FIG. 9 is a diagram showing a sectional structure of a light emitting device, and FIG. 10 is a top view showing one pixel. FIG. 9 is the sectional view taken along the line A–A' in FIG. 10. In FIGS. 9 and 10, the same components are denoted by the same symbols for cross reference.

Reference symbol 201 in FIG. 9 denotes a transparent electrode, 202, an organic compound layer and 203, a cathode. An area in which the transparent electrode 201, the organic compound layer 202, and the cathode 203 overlap one another corresponds to a light emitting element 200. 220 denotes a light reflector. A current controlling TFT 206 is formed on a substrate 208 having an insulating surface. Denoted by 209 is air, 205, a first interlayer insulating film, 204, a second interlayer insulating film, 207, a passivation film, and 214, a resin film. A power supply line, a gate electrode, a connection wiring line, and a source line are denoted by 211, 212, 221, and 213, respectively.

In a manufacture process according to this embodiment mode, the gate electrode 212 of the current controlling TFT 206 is formed on the substrate 208 having an insulating surface. Thereafter, the first interlayer insulating film 205 is formed so as to cover the current controlling TFT 206. Holes (contact holes) for forming the power supply line 211, the connection wiring line 221, and the light reflector 220 are then formed in the first interlayer insulating film 205.

The power supply line 211 is formed to be connected to the current controlling TFT 206 through the hole formed in the first interlayer insulating film 205. The connection wiring line 221 is formed to be connected to the current controlling TFT 206 through the hole formed in the first interlayer insulating film 205. The power supply line 211, the connection wiring line 221, and the source line 213 are formed simultaneously.

A resin film 214 is formed so as to cover the first interlayer insulating film 205, the power supply line 211, the connection wiring line 221, and the source line 213. The resin film 214 is then patterned. The patterning has to be made in a manner that electrically connects the transparent electrode 201 to be formed on the resin film 214 to the connection wiring line 221. The resin film 214 may be formed before the power supply line 211 is formed.

The resin film 214 in FIGS. 9 and 10 is formed in an area where the light reflector 220 is not placed so that the resin film overlaps the transparent electrode 201. However, the present invention is not limited thereto. The resin film 214 may be applied to the entire surface and which part of the resin film is to be patterned can be determined at designer's discretion. Alternatively, the resin film may be patterned into a plurality of columns so that each pixel can have one of the columnar resin films.

The resin film 214 is 2 to 50 $\mu$m in thickness, and a thicker resin film is better as long as it is within the above range. The resin film 214 can be formed from a material containing as its main ingredient one of spherical $SiO_2$ (silicon dioxide), polystyrene, polyimide, polyamide, acrylic, and polyvinyl cinnamate. Other than the materials above, a known spacer material for use in liquid crystal display devices or the like may be used.

The transparent electrode 201 is formed so as to cover the first interlayer insulating film 205 and most of the resin film 214. At this point, the transparent electrode 201 is electrically connected to the connection wiring line 221. When the transparent electrode 201 is formed, a resist mask or the like is used to cover the hole for forming the light reflector 220 in order to avoid forming the transparent electrode on the hole.

The second interlayer insulating film 204 is formed next so as to cover the transparent electrode 201. Thereafter the second interlayer insulating film 204 is partially etched to expose the transparent electrode 201.

The organic compound layer 202, the cathode 203, and the passivation film 207 are laid in this order while covering the transparent electrode 201 and the second interlayer insulating film 204. When laying the organic compound layer 202, the cathode 203, and the passivation film 207 in order, the hole for forming the light reflector 220 is also covered. The area in which the transparent electrode 201, the organic compound layer 202, and the cathode 203 overlap one another corresponds to the light emitting element 200.

The polarity of the current controlling TFT 206 may either be n channel type or p channel type. However, p channel type is preferred here since the transparent electrode 201 in FIG. 9 serves as an anode.

The hole for forming the light reflector 220 may be opened after the first interlayer insulating film 205 and then the second interlayer insulating film 204 are formed. Alternatively, the hole may be opened through two steps; a part of the hole is formed after the first interlayer insulating film 205 is formed and the rest of the hole is formed after the second interlayer insulating film 204 is formed.

An arrow started from the organic compound layer 202 in FIG. 9 indicates a direction light emitted from the organic compound layer 202 travels. Of light emitted from the organic compound layer 202, one that has a large exit angle is reflected at the light reflector 220 to reach outside of the substrate 208 since the light reflector 220 is slanted with respect to the substrate 208.

In FIG. 9, the organic compound layer 202 is formed to come into contact with the first interlayer insulating film 205 and the second interlayer insulating film 204 in the hole (contact hole) for forming the light reflector 220, then the cathode 203 is formed on the organic compound layer 202, and then the passivation film is formed on the cathode 203. However, the present invention is not limited thereto. Light emitted from the organic compound layer 202 is reflected by the cathode 203. Therefore the cathode 203 alone may cover the hole (contact hole).

In FIG. 10, the area for forming the light reflector 220, which is to cover the hole (contact hole), is merely indicated by the dotted line instead of marking the hole (contact hole) for clearer view. The area of the pixel where the light reflector 220 is to be formed is not particularly limited and can be determined at designer's discretion.

The cathode 203 is formed in the hole (contact hole) for forming the light reflector 220 in this embodiment mode. However, the present invention is not limited thereto. The same material that is used to form the power supply line 211 and the source line 213 may be employed to cover the hole (contact hole) for forming the light reflector 220. Then the light reflector 220 may not be connected to the source line 213 and the power supply line 211, or may be connected to these lines. In that case, the light reflector 220 must not be electrically connected to the transparent electrode 201 in order to avoid short circuit of current flowing in the pixel.

This embodiment mode may be combined freely with Embodiment Modes 1 through 3.

Embodiment Mode 5

Figures 11A, 11B:
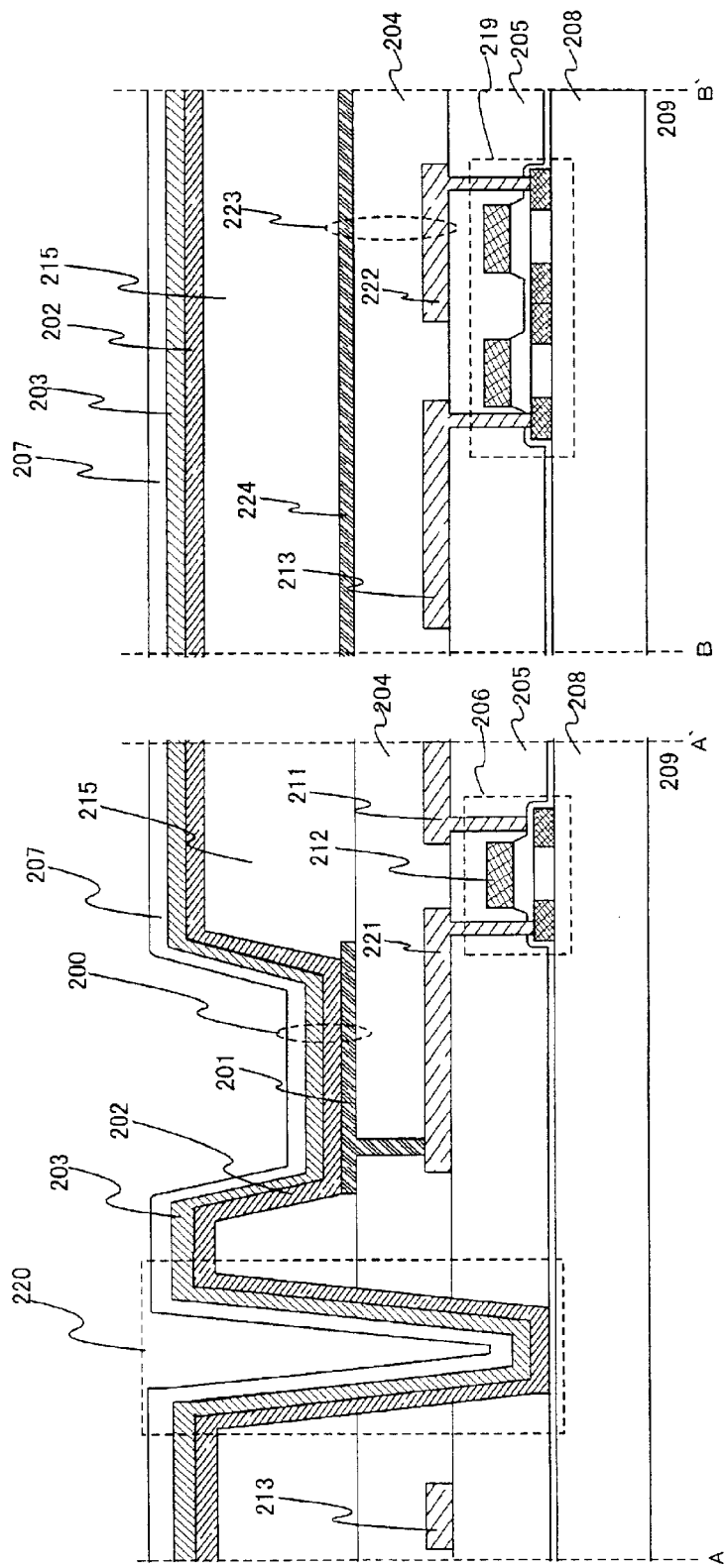
FIGS. 11A and 11B are sectional views of a pixel in a light emitting device of the present invention.
Figure 12:
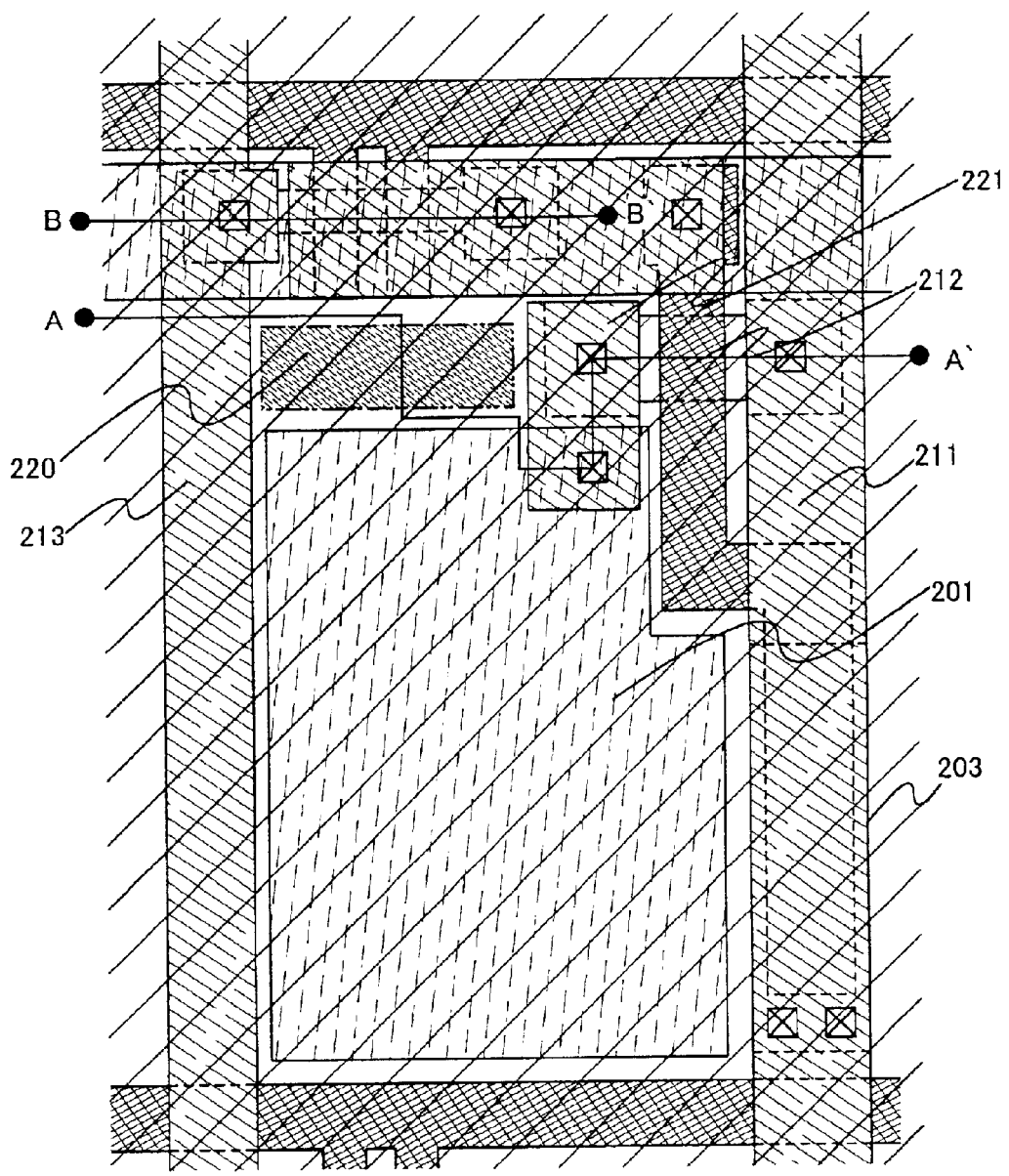
FIG. 12 is a top view of a pixel in a light emitting device of the present invention.
Figure 13:
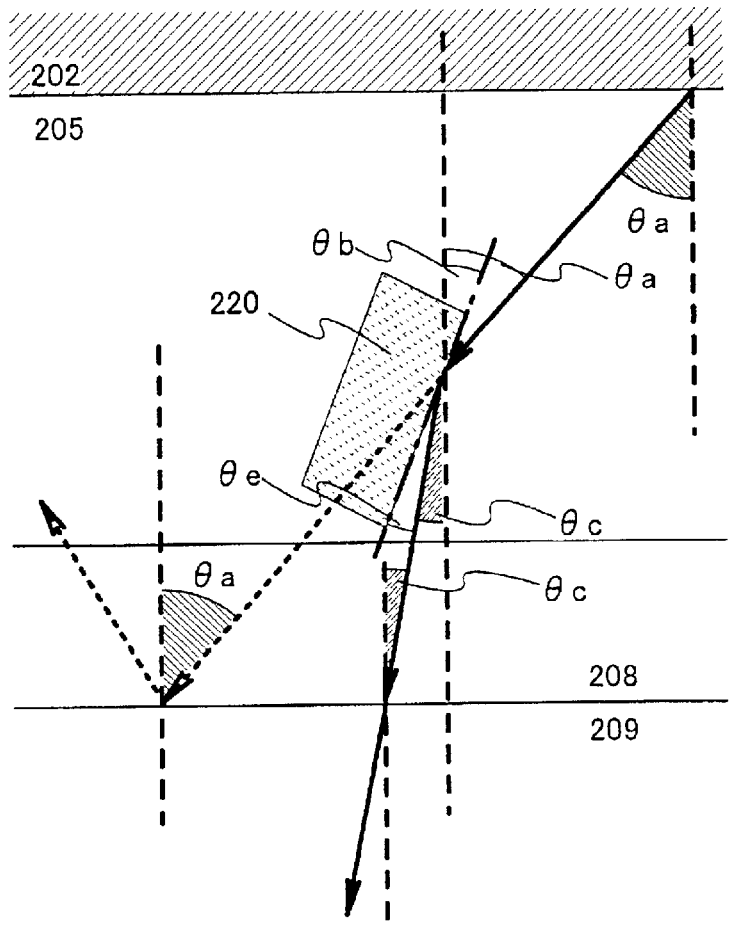
FIG. 13 is a diagram illustrating a taper angle of a light reflector of the present invention.

This embodiment mode describes an example of using a cathode of a light emitting element as a light reflector, which is different from the examples in Embodiment Modes 2 through 4. The description is given with reference to FIGS. 11A, 11B, and 12. FIGS. 11A and 11B are diagrams showing a sectional structure of a light emitting device, and FIG. 12 is a top view showing one pixel. FIG. 11A is the sectional view taken along the line A–A' in FIG. 12. FIG. 11B is the sectional view taken along the line B–B' in FIG. 12. In FIGS. 11A, 11B, and 12, the same components are denoted by the same symbols for cross reference.

Reference symbol 201 in FIGS. 11A and 11B denotes a transparent electrode, 202, an organic compound layer and 203, a cathode. An area in which the transparent electrode 201, the organic compound layer 202, and the cathode 203 overlap one another corresponds to a light emitting element 200. 220 denotes a light reflector. Denoted by 209 is air, 205, a first interlayer insulating film, 204, a second interlayer insulating film, and 215, a third interlayer insulating film. A power supply line, a gate electrode, a connection wiring line, a source line, another connection line, and a capacitance wiring line are denoted by 211, 212, 221, 213, 222, and 224, respectively.

Denoted by 206 and 219 in FIGS. 11A and 11B are a current controlling TFT and a switching TFT, respectively. The TFTs are formed on a substrate 208 having an insulating surface.

The first interlayer insulating film 205 is formed to cover the current controlling TFT 206 and the switching TFT 219. The source line 213, the connection wiring line 221, the power supply line 211, and the connection wiring line 222 are formed on the first interlayer insulating film 205.

The source line 213 is connected to the switching TFT 219 through a hole (contact hole) formed in the first interlayer insulating film 205. The connection wiring line 221 is connected to the current controlling TFT 206 through a hole formed in the first interlayer insulating film 205.

The connection wiring line 222 is connected to the switching TFT 219 through a hole formed in the first interlayer insulating film 205. The power supply line 211 is connected to the current controlling TFT 206 through a hole formed in the first interlayer insulating film 205.

The second interlayer insulating film 204 is formed on the first interlayer insulating film 205 so as to cover the source line 213, the connection wiring lines 221 and 222, and the power supply line 211. The transparent electrode 201 is formed on the second interlayer insulating film 204.

The transparent electrode 201 is electrically connects to the connection wiring line 221 through a hole (contact hole) formed in the second interlayer insulating film 204.

In this embodiment mode, a capacitor storage 223 is formed in an area where the second interlayer insulating film 204 is sandwiched between the connection wiring line 222 and the capacitance wiring line 224. The capacitance wiring line 224 can be formed from the same conductive film that is used to form the transparent electrode 201 and, therefore, the capacitor storage can be obtained without increasing the number of manufacture steps. The capacitor storage 223 is formed so as to overlap the switching TFT 219, thereby controlling reduction of aperture ratio.

The third interlayer insulating film 215 is formed next on the second interlayer insulating film 204 so as to cover the capacitance wiring line 224 and the transparent electrode 201. Thereafter the third interlayer insulating film 215 is partially etched to expose the transparent electrode 201.

The organic compound layer 202 and the cathode 203 are laid in this order while covering the pixel electrode (transparent electrode) 201 and the third interlayer insulating film 215. The area in which the transparent electrode 201, the organic compound layer 202, and the cathode 203 overlap one another corresponds to the light emitting element 200.

Structures of the TFTs in this embodiment mode are not limited to those shown in FIGS. 11A and 11B. The device of the present invention may have, in addition to the capacitor storage 223 composed of the connection wiring line 222 and the capacitance wiring line 224, a capacitor storage that is structured differently The connection wiring line 222 in the present invention is formed so as to overlap the switching TFT 219. Therefore the switching TFT 219 is prevented from receiving OFF current when the switching TFT 219 is irradiated with light that is emitted from the light emitting element or light that has entered the light emitting device from the outside.

In this embodiment mode, the polarity of the current controlling TFT 206 may either be n channel type or p channel type and the same applies to the switching TFT 219. However, p channel type is preferred for the current controlling TFT 206 here since the transparent electrode 201 in FIGS. 11A and 11B serves as an anode.

Although the example shown in this embodiment mode has two TFTs in the pixel, the present invention is not limited thereto.

This embodiment mode may be combined freely with Embodiment Modes 1 through 4.

Embodiment Mode 6

Figure 27:
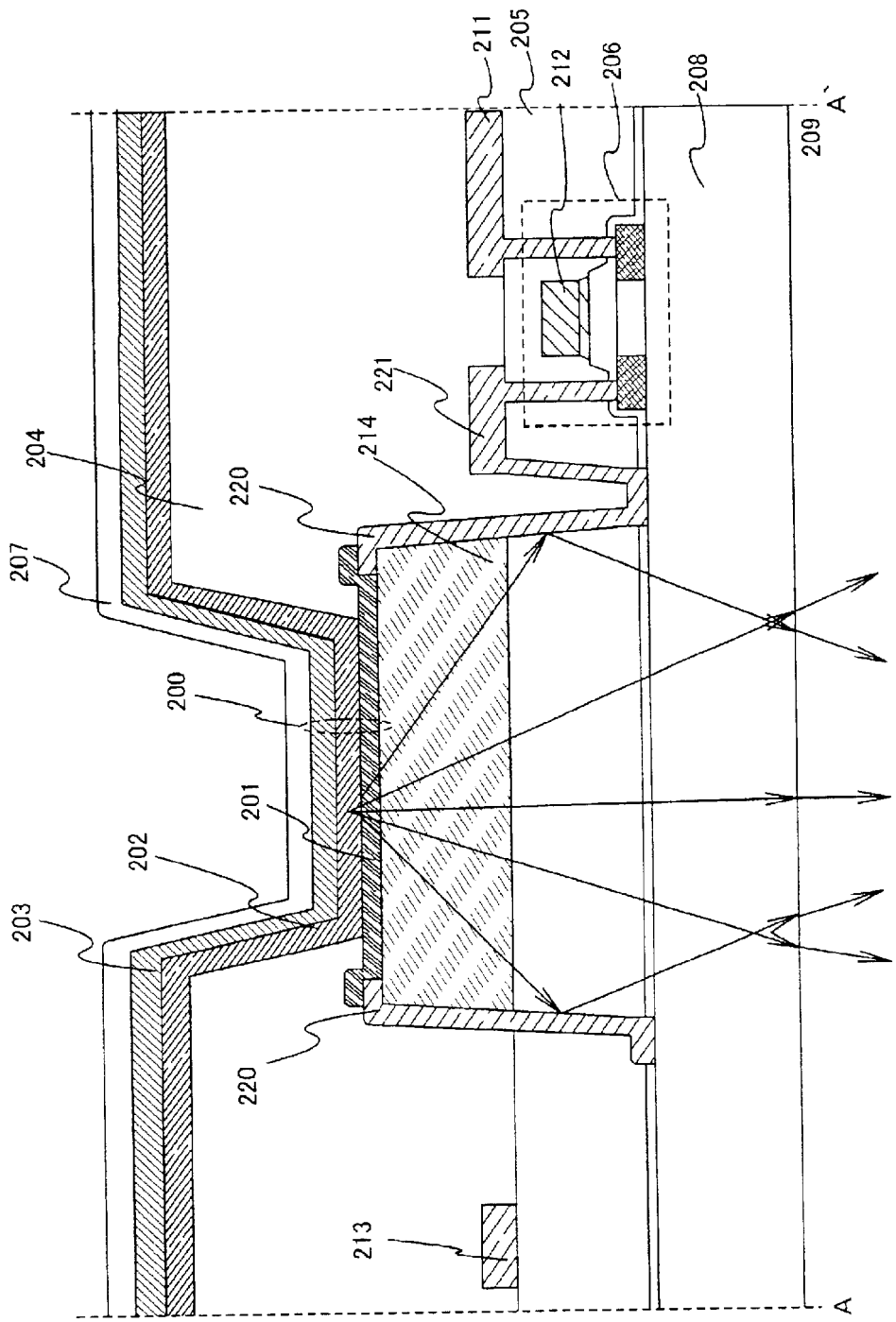
FIG. 27 is a sectional view of a pixel in a light emitting device of the present invention.
Figure 28:
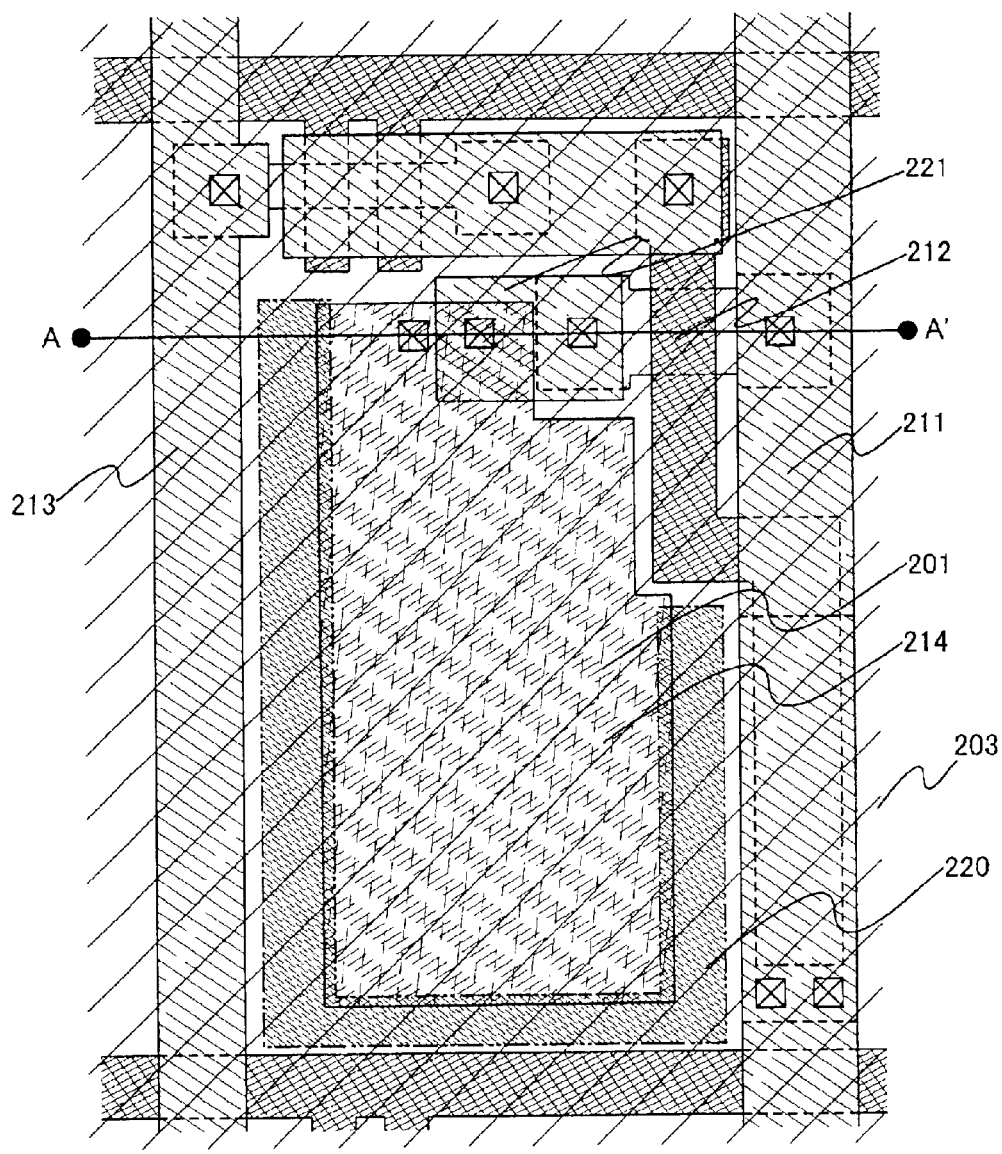
FIG. 28 is a top view of a pixel in a light emitting device of the present invention.

This embodiment mode describes a light emitting device that is different from the devices in Embodiment Modes 1 through 5. FIG. 27 is a diagram showing a sectional structure of the light emitting device, and FIG. 28 is a top view showing one pixel. FIG. 27 is the sectional view taken along the line A–A' in FIG. 28. In FIGS. 27 and 28, the same components are denoted by the same symbols for cross reference.

Reference symbol 201 in FIG. 27 denotes a transparent electrode, 202, an organic compound layer and 203, a cathode. An area in which the transparent electrode 201, the organic compound layer 202, and the cathode 203 overlap one another corresponds to a light emitting element 200. 220 denotes light reflectors. A current controlling TFT 206 is formed on a substrate 208 having an insulating surface. Denoted by 209 is air, 205, a first interlayer insulating film, 204, a second interlayer insulating film, 207, a passivation film, and 214, a resin film. A power supply line, a gate electrode, a connection wiring line, and a source line are denoted by 211, 212, 221, and 213, respectively.

In a manufacture process according to this embodiment mode, the gate electrode 212 of the current controlling TFT 206 is formed on the substrate 208 having an insulating surface. Thereafter, the first interlayer insulating film 205 is formed so as to cover the current controlling TFT 206. Holes (contact holes) for forming the power supply line 211, the connection wiring line 221, and the light reflectors 220 are then formed in the first interlayer insulating film 205.

The power supply line 211 is formed to be connected to the current controlling TFT 206 through the hole formed in the first interlayer insulating film 205. The connection wiring line 221 is formed to be connected to the current controlling TFT 206 through the hole formed in the first interlayer insulating film 205. The power supply line 211, the connection wiring line 221, and the source line 213 are formed simultaneously.

The resin film 214 is formed so as to cover the first interlayer insulating film 205 and the source line 213. The resin film 214 is then patterned. The patterning has to be made in a manner that electrically connects the transparent electrode 201 to be formed on the resin film 214 to the connection wiring line 221. The resin film 214 may be formed before the power supply line 211 is formed.

The resin film 214 in FIGS. 27 and 28 is formed in an area where the light reflector 220 is not placed so that the resin film overlaps the transparent electrode 201. However, the present invention is not limited thereto. The resin film 214 may be applied to the entire surface and which part of the resin film is to be patterned can be determined at designer's discretion. Alternatively, the resin film 214 may be patterned into a plurality of columns so that each pixel can have one of the columnar resin films. In this embodiment mode, the resin film 214 is sandwiched between the light reflectors 220, and light emitted from the organic compound layer 202 above the resin film 214 is reflected at the light reflectors 220. Accordingly, if the resin film 214 is patterned into columns, holes for forming the light reflectors 220 have to be opened around the resin film columns so that light emitted from the organic compound layer 202 above the resin film 214 is reflected at the light reflectors 220.

The resin film 214 is preferably 2 to 50 μm in thickness, and a thicker resin film is better as long as it is within the above range. The resin film 214 can be formed from a material containing as its main ingredient one of spherical $SiO_2$ (silicon dioxide), polystyrene, polyimide, polyamide, acrylic, and polyvinyl cinnamate. Other than the materials above, a known spacer material for use in liquid crystal display devices or the like may be used.

The transparent electrode 201 is formed so as to cover the resin film 214. At this point, the transparent electrode 201 is electrically connected to the connection wiring line 221. When the transparent electrode 201 is formed, a resist mask or the like is used to cover the holes for forming the light reflectors 220 in order to avoid forming the transparent electrode on the holes.

The second interlayer insulating film 204 is formed next so as to cover the transparent electrode 201. Thereafter the second interlayer insulating film 204 is partially etched to expose the transparent electrode 201.

The organic compound layer 202, the cathode 203, and the passivation film 207 are laid in this order while covering the transparent electrode 201 and the second interlayer insulating film 204. When laying the organic compound layer 202, the cathode 203, and the passivation film 207 in order, the holes for forming the light reflectors 220 are also covered. The area in which the transparent electrode 201, the organic compound layer 202, and the cathode 203 overlap one another corresponds to the light emitting element 200.

The polarity of the current controlling TFT 206 may either be n channel type or p channel type. However, p channel type is preferred here since the transparent electrode 201 in FIG. 27 serves as an anode.

The holes for forming the light reflectors 220 may be opened after the first interlayer insulating film 205 and then the second interlayer insulating film 204 are formed. Alternatively, the holes may be opened through two steps; the holes are partially formed after the first interlayer insulating film 205 is formed and the rest is formed after the second interlayer insulating film 204 is formed.

An arrow started from the organic compound layer 202 in FIG. 27 indicates a direction light emitted from the organic compound layer 202 travels. Of light emitted from the organic compound layer 202, one that has a large exit angle is reflected at the light reflectors 220 to reach outside of the substrate 208 since the light reflectors 220 are slanted with respect to the substrate 208.

In FIG. 28, the areas for forming the light reflectors 220, which are to cover the holes, are merely indicated by the dotted lines instead of marking the holes for clearer view. The areas of the pixel where the light reflectors 220 are to be formed are not particularly limited and can be determined at designer's discretion. The light reflectors 220 are connected to the transparent electrode 201 in FIGS. 27 and 28. However, the present invention is not limited thereto and the reflectors may not be connected to the transparent electrode.

The holes (contact holes) for forming the light reflectors 220 may be covered with the same material that is used to form the power supply line 211 and the source line 213. Then the light reflectors 220 may not be connected to the source line 213 and the power supply line 211, or may be connected to these lines. In that case, the light reflectors 220 must not be electrically connected to the transparent electrode 201 in order to avoid short circuit of current flowing in the pixel.

This embodiment mode may be combined freely with Embodiment Modes 1 through 5.

Embodiment 1

Figure 14A:
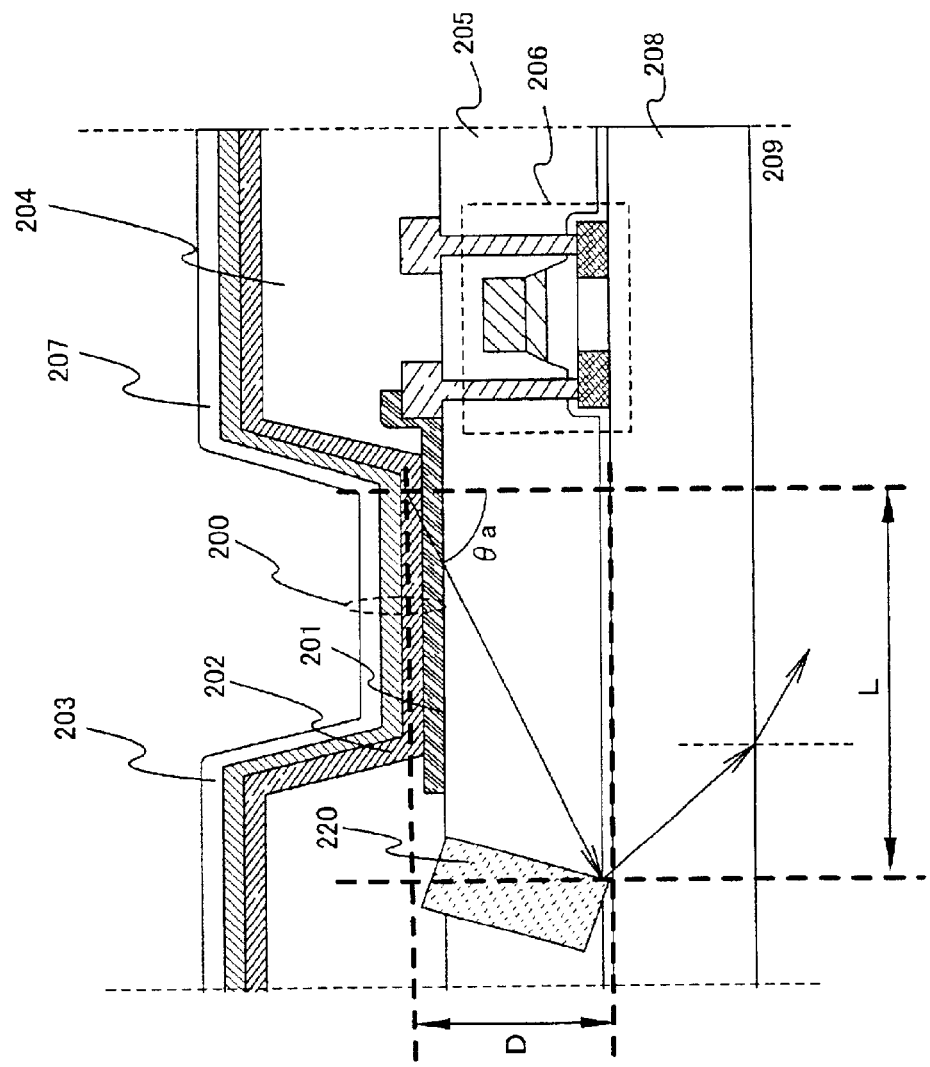
FIGS. 14A and 14B are diagrams illustrating a light reflector of the present invention.
Figure 14B:
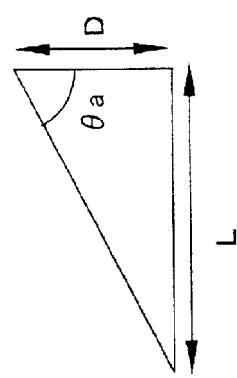
Figure 15:
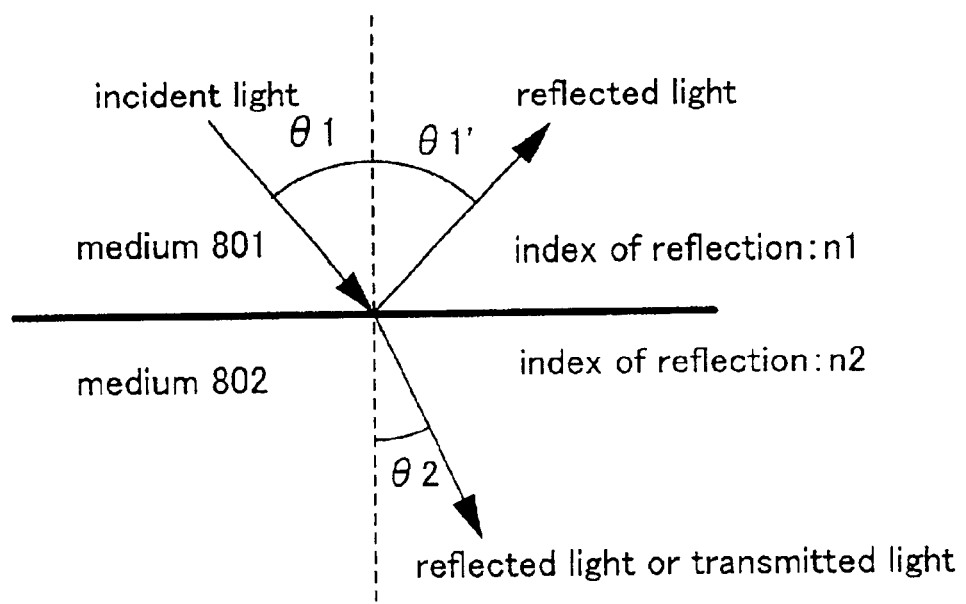
FIG. 15 is a diagram illustrating Snell's Law.
Figure 16:
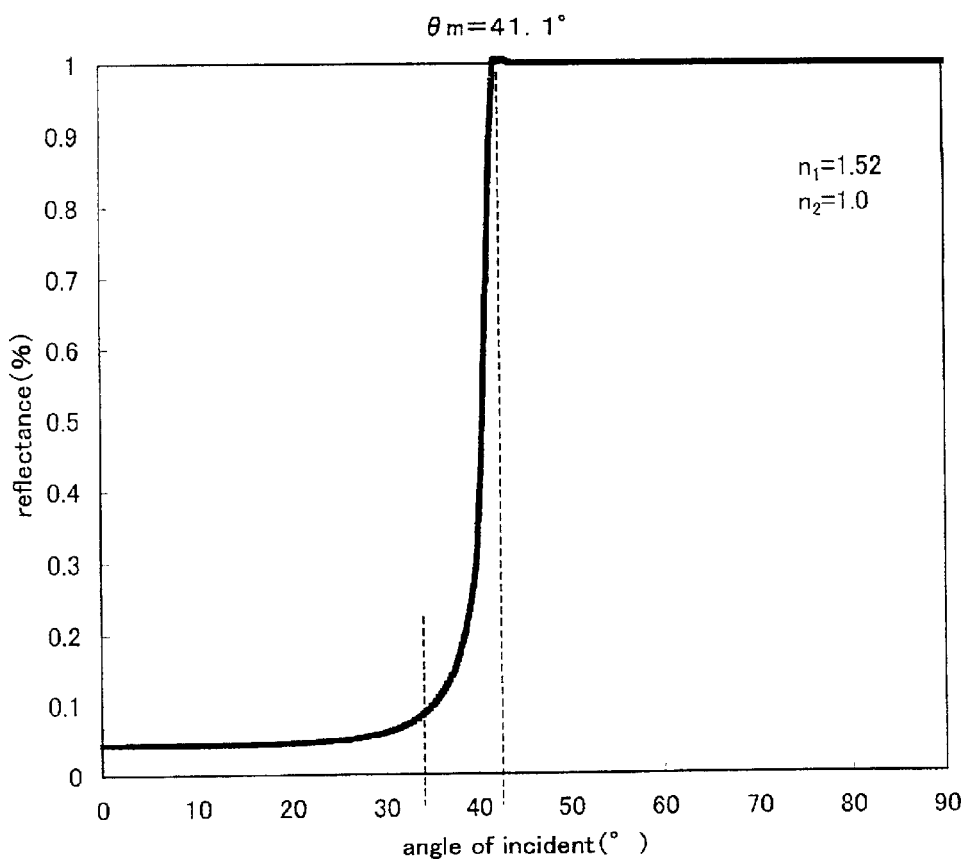
FIG. 16 is a graph showing the relation between angle of incident and reflectance.
Figure 17:
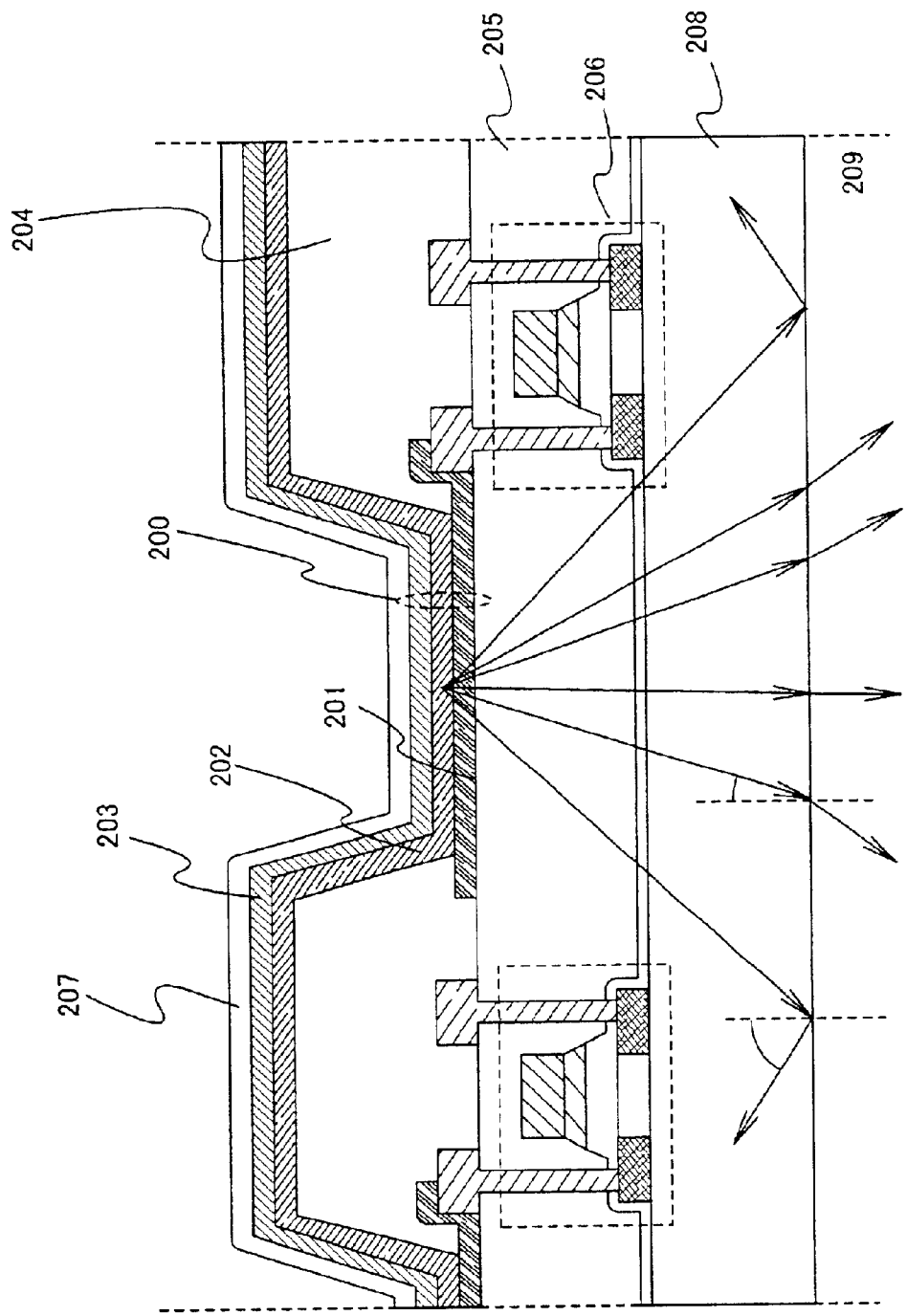
FIG. 17 is a sectional view of a pixel.

This embodiment describes the optimal distance relation between an organic compound layer 202 and a light reflector 220 with reference to FIGS. 14A and 14B.

In a light emitting device shown in FIGS. 14A and 14B, a lateral direction means the direction perpendicular to light that is emitted from the organic compound layer 202 vertically to the substrate 208. A longitudinal direction means the direction perpendicular to the lateral direction defined as above. Now, the maximum value for the shortest distance in the lateral direction to the light reflector 220 from the light emission region of the organic compound layer 202 is given as L. The maximum thickness in the longitudinal direction from the organic compound layer 202 to the light reflector 220 is given as D. The exit angle of light emitted from the organic compound layer 202 is given as θa. Then the following Mathematic Expression 15 is satisfied.

Mathematic Expression 15

$$\tan \theta a = L/D \tag{15}$$

Assume here that a substrate 208 is a glass substrate. Then, as described above, light with θa larger than 41° cannot be taken out the substrate 208 unless it is emitted toward the light reflector 220. In other words, the following Mathematic Expression 16 has to be satisfied in order to direct light with θa larger than 41° toward the light reflector 220.

Mathematic Expression 16

$$\tan 41° = 0.869 < \tan \theta a \tag{16}$$

The following Mathematic Expression 17 is obtained by substituting the Expression 15 for tan θa in the Expression 16.

Mathematic Expression 17

$$0.869 < L/D \tag{17}$$

The Expression 17 shows that L is desirably smaller than D when the substrate 208 is a glass substrate. It is also understood from the expression that the ratio of light reaching the light reflector 220 to the total amount of light emitted from the organic compound layer 202 is increased as the solution of D minus L takes a larger value. When the critical angle at the interface between the substrate 208 and air 209 is given as θf, the following Mathematic Expression 18 is obtained.

Mathematic Expression 18

$$\tan \theta f > L/D \tag{18}$$

In conclusion, it is preferable to form the organic compound layer 202 and the light reflector 220 so as to satisfy the Expression 18.

This embodiment may be combined freely with Embodiment Modes 1 through 6.

Embodiment 2

Figure 18:
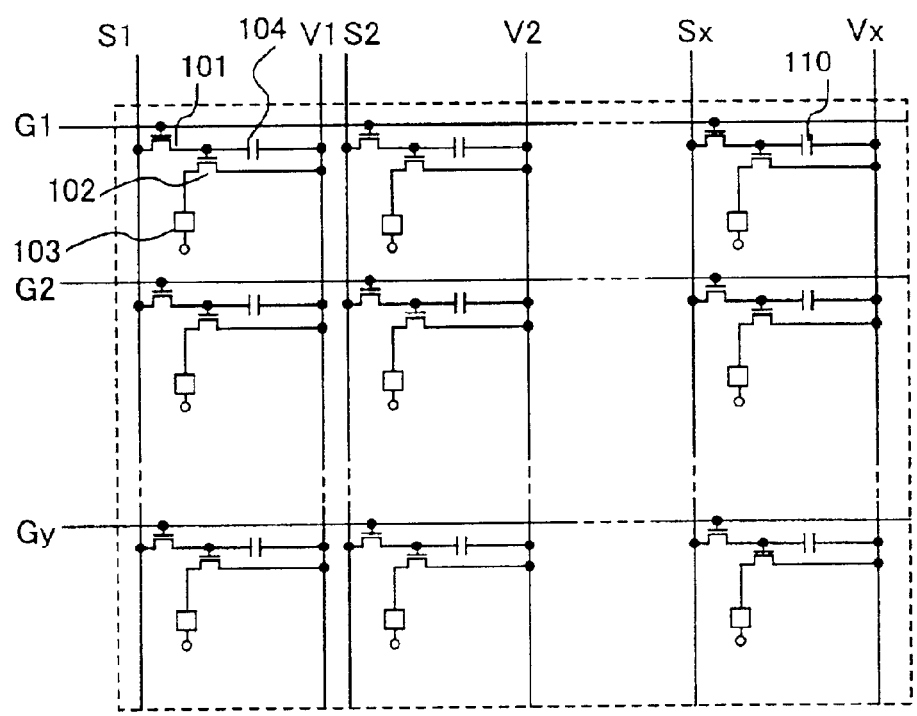
FIG. 18 is a circuit diagram of a pixel portion in a light emitting device of the present invention.
Figure 19:
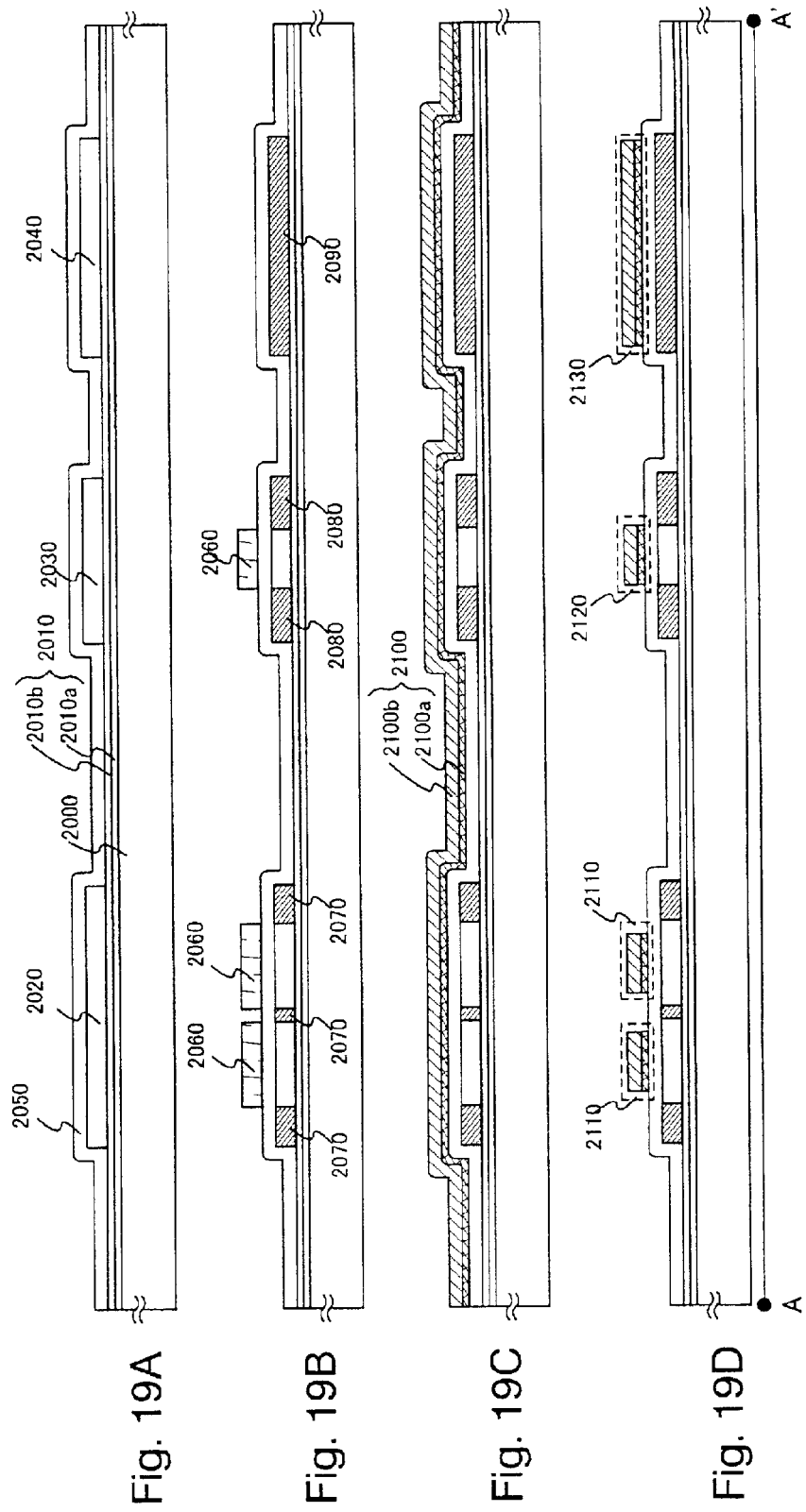
FIGS. 19A to 19D are diagrams showing a process of manufacturing a light emitting device of the present invention.

FIG. 18 is a circuit diagram of a pixel portion in a light emitting device of the present invention. Reference symbol 101 denotes a switching TFT, 102, a current controlling TFT, 103, a light emitting element, and 104, a capacitor storage.

The pixel portion has source lines S1 to Sx, power supply lines V1 to Vx, and gate lines G1 to Gy formed thereon. Each pixel has one of the source lines S1 to Sx, one of the power supply lines V1 to Vx, and one of the gate lines G1 to Gy.

This embodiment may be combined freely with Embodiment Modes 1 through 6 and Embodiment 1.

Embodiment 3

Figure 29:
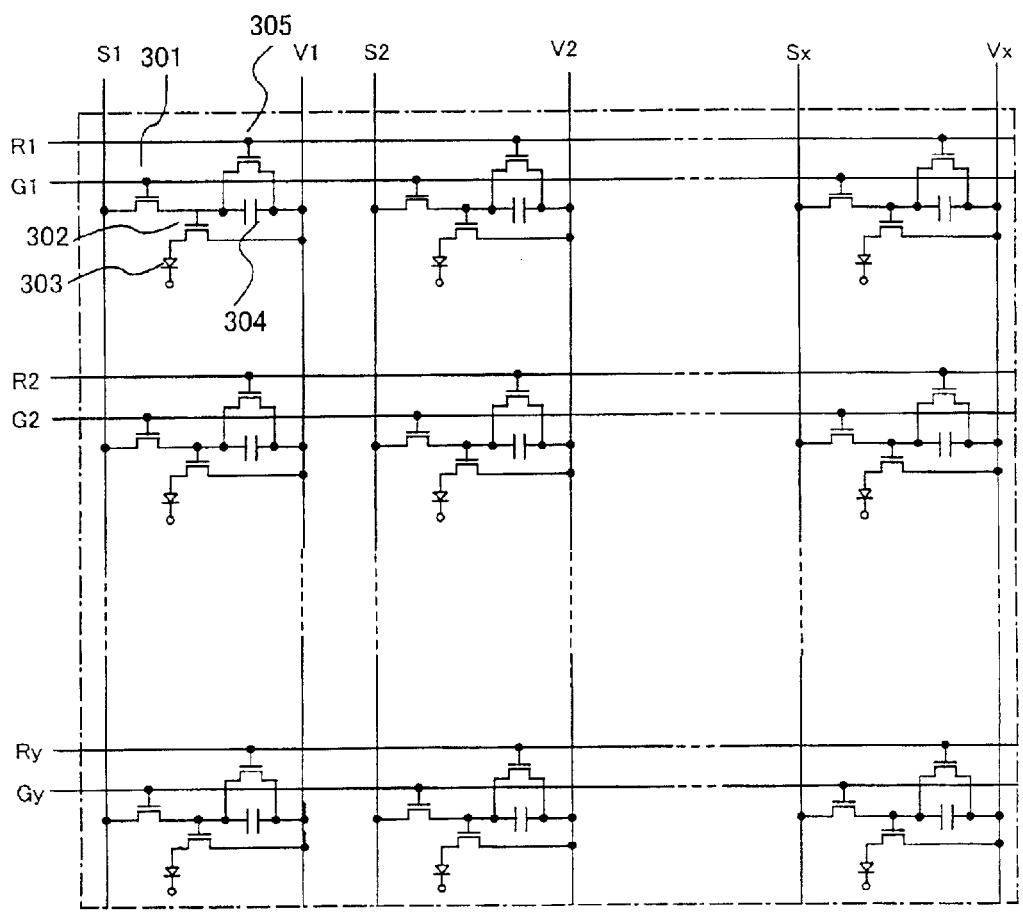
FIG. 29 is a circuit diagram of a pixel portion in a light emitting device of the present invention.

FIG. 29 is a circuit diagram of a pixel portion in a light emitting device of the present invention. Reference symbol 301 denotes a switching TFT, 302, a current controlling TFT, 303, a light emitting element, 304, a capacitor storage, and 305, a reset TFT.

The pixel portion has source lines S1 to Sx, power supply lines V1 to Vx, gate lines G1 to Gy, and reset lines R1 to Rx formed thereon. Each pixel has one of the source lines S1 to Sx, one of the power supply lines V1 to Vx, one of the gate lines G1 to Gy, and one of the reset lines R1 to Rx.

This embodiment may be combined freely with Embodiment Modes 1 through 6 and Embodiment 1.

Embodiment 4

A description is given with reference to FIGS. 19 to 23 on an example of a method of manufacturing a light emitting device according to the present invention. The description is given step by step about details of a method of using a metal film as a light reflector.

First, a glass substrate 2000 is prepared. Barium borosilicate glass, typical example of which is Corning #7059 glass or #1737 glass (product of Corning Incorporated), or alumino borosilicate glass is usable as the substrate 2000. The substrate 2000 can be any light-transmissive substrate, and a quartz substrate may also be used. A plastic substrate may be employed if it has heat resistance against the process temperature of this embodiment.

Next, as shown in FIG. 19A, a base film 2010 is formed on the substrate 2000 from an insulating film such as a silicon oxide film, a silicon nitride film, or a silicon oxynitride film. In this embodiment, the base film 2010 has a two-layer structure. However, a single layer or more than two layers of the insulating films listed above may be used as the base film. The first layer of the base film 2010 is a silicon oxynitride film 2010a formed to have a thickness of 10 to 200 nm (preferably 50 to 100 nm) by plasma CVD using as reaction gas $SiH_4$, $NH_3$, and $N_2O$. The silicon oxynitride film 2010a (composition ratio: Si=32%, O=27%, N=24%, H=17%) formed in this embodiment has a thickness of 50 nm. The second layer of the base film 2010 is a silicon oxynitride film 2010b formed to have a thickness of 50 to 200 nm (preferably 100 to 150 nm) by plasma CVD using as reaction gas $SiH_4$ and $N_2O$. The silicon oxynitride film 2010b (composition ratio: Si=32%, O=59%, N=7%, H=2%) formed in this embodiment has a thickness of 100 nm.

On the base film 2010, semiconductor layers 2020 to 2040 are formed. The semiconductor layers 2020 to 2040 are formed by patterning into a desired shape a crystalline semiconductor film that is obtained by forming a semiconductor film with an amorphous structure through a known method (sputtering, LPCVD, plasma CVD, or the like) and then subjecting the film to known crystallization treatment (e.g., laser crystallization, thermal crystallization, or thermal crystallization using nickel or other catalysts). The semiconductor layers 2020 to 2040 are each 25 to 80 nm in thickness (preferably 30 to 60 nm). The material of the crystalline semiconductor film is not limited but silicon or a silicon germanium ($Si_XGe_{1-X}$ (X=0.0001 to 0.02)) alloy is preferable. In this embodiment, an amorphous silicon film with a thickness of 55 nm is formed by plasma CVD and then a solution containing nickel is held to the top face of the amorphous silicon film. The amorphous silicon film is subjected to dehydrogenation (at 500° C., for an hour), then to thermal crystallization (at 550° C., for four hours), and then to laser annealing treatment for improvement of crystallinity to obtain a crystalline silicon film. Patterning treatment using photolithography is conducted on this crystalline silicon film to form the semiconductor layers 2020 to 2040.

The semiconductor layers 2020 to 2040 may be doped with a minute amount of impurity element (boron or phosphorus) in order to control the threshold of the TFTs.

If laser crystallization is used to form the crystalline semiconductor film, a pulse oscillating or continuous wave excimer laser, YAG laser, or $YVO_4$ laser can be employed. Laser light emitted from these laser oscillators is preferably collected into a linear beam by an optical system before irradiating the semiconductor film. Though conditions of crystallization can be set suitably by an operator, there are some preferred conditions. When an excimer laser is used, preferable conditions include setting the pulse oscillation frequency to 300 Hz, and the laser energy density to 100 to 400 $mJ/cm^2$ (typically, 200 to 300 $mJ/cm^2$). When a YAG laser is used, preferable conditions include using the second harmonic thereof, and setting the pulse oscillation frequency to 30 to 300 kHz and the laser energy density to 300 to 600 $mJ/cm^2$ (typically, 350 to 500 $mJ/cm^2$). The laser light is collected into a linear beam having a width of 100 to 1000 $\mu m$, 400 $\mu m$, for example, to irradiate the entire surface of the substrate with the beam. In the irradiation, the overlap ratio of the linear laser light is set to 50 to 98%.

Next, a gate insulating film 2050 is formed to cover the semiconductor layers 2020 to 2040. The gate insulating film 2050 is formed from an insulating film containing silicon by plasma CVD or sputtering to have a thickness of 40 to 150 nm. This embodiment uses a silicon oxynitride film (composition ratio: Si=32%, O=59%, N=7%, H=2%) formed by plasma CVD to have a thickness of 110 nm. The gate insulating film is not limited to the silicon oxynitride film, of course, but may be a single layer or a laminate of other insulating films containing silicon.

When a silicon oxide film is used for the gate insulating film, the film is formed by plasma CVD in which TEOS (tetraethyl orthosilicate) and $O_2$ are mixed, the reaction pressure is set to 40 Pa, the substrate temperature is set to 300 to 400° C., and the high frequency (13.56 MHz) power density is set to 0.5 to 0.8 $W/cm^2$ for electric discharge. The silicon oxide film thus formed can provide excellent characteristics as the gate insulating film when the film receives subsequent thermal annealing at 400 to 500° C. The device that has finished the steps above presents the sectional view shown in FIG. 19A.

Resist masks 2060 are formed next and the semiconductor layers are doped with an n type impurity element (phosphorus, in this embodiment) to form impurity regions 2070 to 2090 that contain high concentration of phosphorus. These regions each contain phosphorus in a concentration of $1 \times 10^{20}$ to $5 \times 10^{21}$ atoms/cm$^3$, typically, $2 \times 10^{20}$ to $1 \times 10^{22}$ atoms/cm$^3$ (FIG. 19B).

A heat-resistant conductive layer for forming a gate electrode is formed on the gate insulating film 2050 (FIG. 19C). A heat-resistant conductive layer 2100 may be a single layer or a laminate of two, three, or more layers if necessary. In this embodiment, a laminate of a conductive film (A) 2100a and a conductive film (B) 2100b makes the heat-resistant conductive layer. The heat-resistant conductive layer may be a film containing an element selected from the group consisting of tantalum (Ta), titanium (Ti), molybdenum (Mo), tungsten (W), chromium (Cr), and silicon (Si). Alternatively, the heat-resistant conductive layer may be a conductive film mainly containing one of the elements listed above (typically a tantalum nitride film, a tungsten nitride film, a titanium nitride film, or the like), or an alloy film containing a combination of the elements listed above (typically a Mo—W alloy film, a Mo—Ta alloy film, a tungsten silicide film, or the like). This embodiment uses a TaN film for the conductive film (A) 2100a and a W film for the conductive film (B) 2100b. These films that constitute the heat-resistant conductive layer are formed by sputtering or CVD. In order to reduce the resistance of the films, the concentration of impurities contained in the films should be lowered and the oxygen concentration in particular is preferably reduced to 30 ppm or less. The W film may be formed by sputtering with W as the target, or by thermal CVD using tungsten hexafluoride ($WF_6$). In either case, the W film has to have a low resistivity in order to use the W film as a gate electrode. A desirable resistivity of the W film is 20 $\mu\Omega cm$ or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.99% or 99.9999% is used and a great care is taken not to allow impurities in the air to mix in the W film that is being formed. As a result, the W film can have a resistivity of 9 to 20 $\mu\Omega cm$.

Sputtering can also be used to form a Ta film for the heat-resistant conductive layer 2100. The Ta film is formed by using Ar as sputtering gas. If an appropriate amount of Xe or Kr is added to the sputtering gas, the internal stress of the obtained Ta film is eased to prevent the Ta film from peeling off. The resistivity of a Ta film in α phase is about 20 $\mu\Omega cm$ and is usable as a gate electrode. On the other hand, the resistivity of a Ta film in β phase is about 180 $\mu\Omega cm$ and is not suitable for a gate electrode. A Ta film in α phase can readily be obtained by forming, as a base of a Ta film, a TaN film that has a crystal structure approximate to that of the α phase. Though not shown in the drawings, it is effective to form a silicon film doped with phosphorus (P) to have a thickness of 2 to 20 nm under the heat-resistant conductive layer 2100. This improves adherence to the conductive film to be formed thereon and prevents oxidization. At the same time, the silicon film prevents a minute amount of alkaline metal element contained in the heat-resistant conductive layer 2100 from diffusing into the first shape gate insulating film 2050. Whatever material is used, a preferable resistivity range for the heat-resistant conductive layer 2100 is 10 to 50 $\mu\Omega cm$.

The conductive film (A) 2100a and the conductive film (B) 2100b are then patterned into desired shapes to form gate electrodes 2110 and 2120 and a capacitance electrode 2130 (FIG. 19D). Though not clear in FIG. 19D, the capacitance electrode 2130 is connected to the gate electrode 2120.

Figure 20:
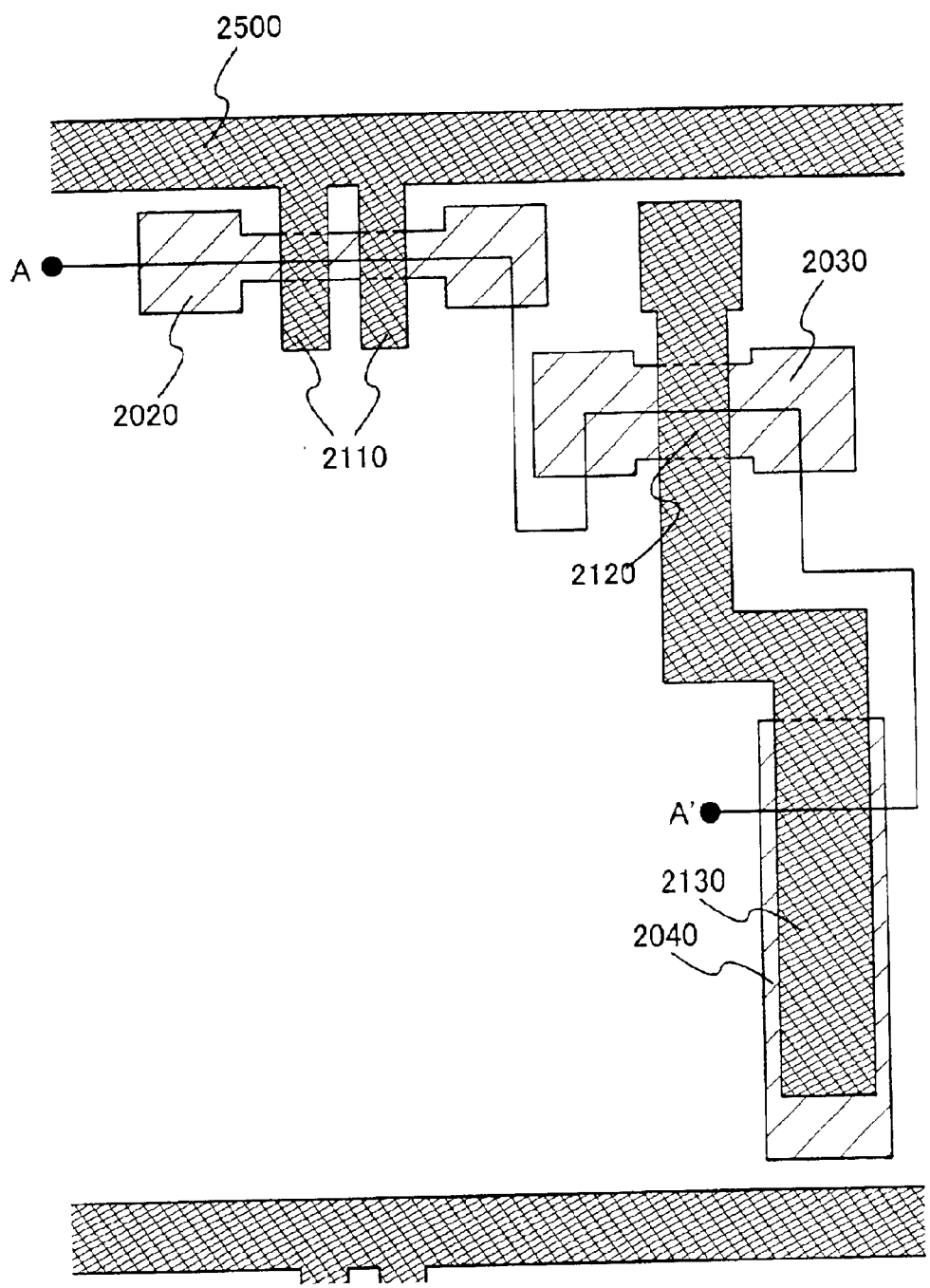
FIG. 20 is a diagram showing a process of manufacturing a light emitting device of the present invention.
Figure 21:
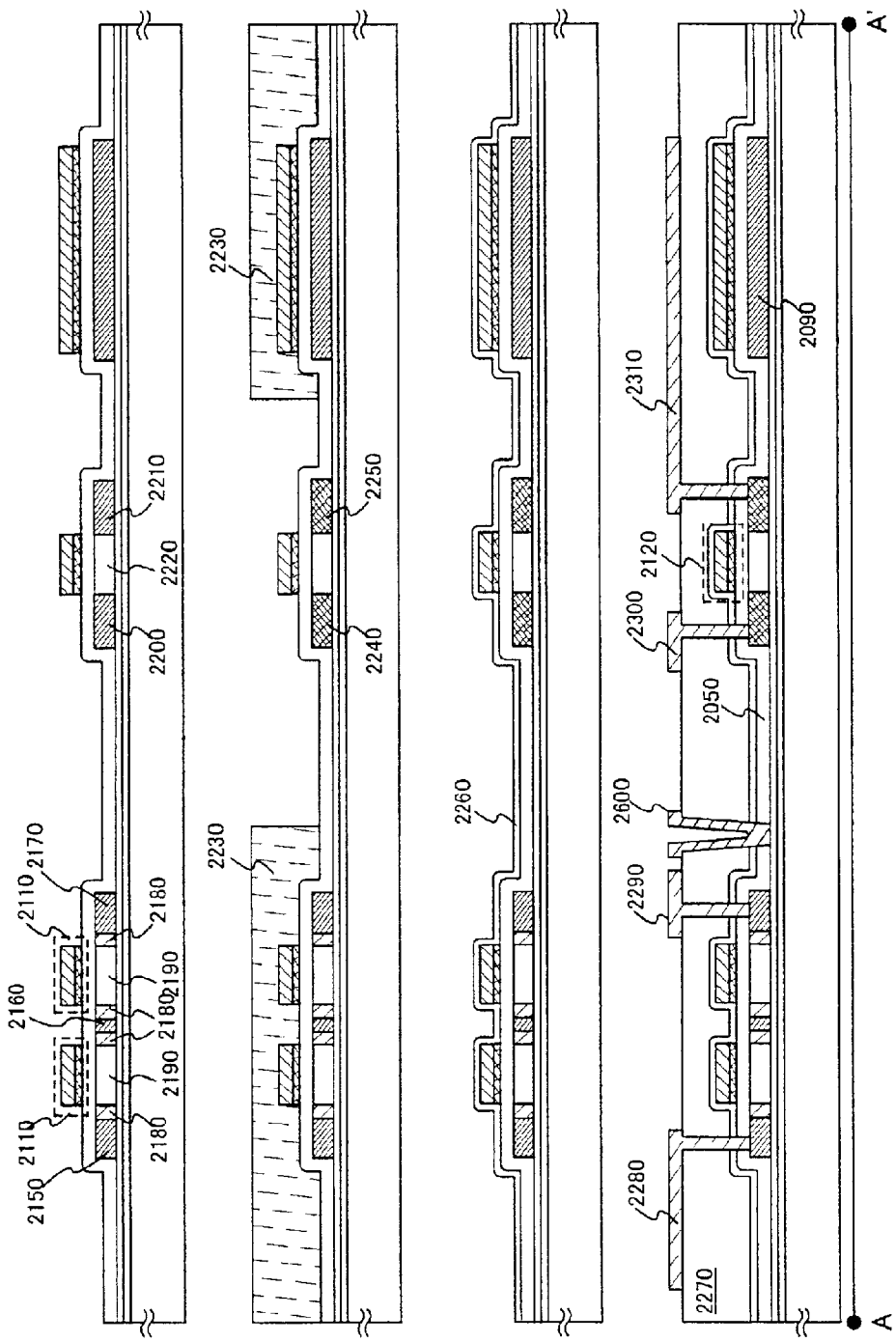
FIGS. 21A to 21D are diagrams showing a process of manufacturing a light emitting device of the present invention.

A top view of the pixel that has finished the step of FIG. 19D is shown in FIG. 20. FIG. 19D corresponds to the sectional view of the pixel taken along the line A–A' in FIG. 20. Note that the gate insulating film 2050 is omitted here for clearer view. Denoted by 2500 is a gate line that is connected to the gate electrode 2110.

Using the gate electrode 2110 as a mask, the semiconductor layers 2020 and 2030 that are to serve as active layers of TFTs are doped with an impurity element for imparting the n type conductivity (hereinafter referred to as n type impurity element). Elements usable as the n type impurity element are ones belonging to Group 15 in the periodic table, typically, phosphorus or arsenic. Formed through this doping step are first impurity regions 2150 to 2170, 2200, and 2210, a second impurity region 2180, and channel formation regions 2190 and 2220. One of the first impurity regions 2150 and 2170 functions as a source region whereas the other functions as a drain region. The second impurity region 2180 is a low concentration impurity region that functions as an LDD region, and contains the n type impurity element in a concentration of $1 \times 10^{16}$ to $5 \times 10^{18}$ atoms/cm$^3$, typically, $1 \times 10^{17}$ to $5 \times 10^{18}$ atoms/cm$^3$ (FIG. 21A).

The regions for forming n-channel TFTs are covered with masks 2230 to dope the semiconductor layer 2030 that is to serve as an active layer of a p-channel TFT with boron as a p type impurity element. The concentration of boron is set to $3 \times 10^{20}$ to $3 \times 10^{21}$ atoms/cm$^3$, typically, $5 \times 10^{20}$ to $1 \times 10^{21}$ atoms/cm$^3$ (FIG. 21B). Through this step, third impurity regions 2240 and 2250 are formed in the semiconductor layer 2030.

Next, a first interlayer insulating film 2260 is formed on the gate electrodes 2110 and 2120, the capacitance electrode 2130, and the gate insulating film 2050. The first interlayer insulating film 2260 may be a silicon oxide film, a silicon oxynitride film, or a silicon nitride film, or may be a laminate having these insulating films in combination. In any case, the first interlayer insulating film 2260 is formed from an inorganic insulating material. The thickness of the first interlayer insulating film 2260 is set to 100 to 200 nm. If a silicon oxide film is used for the first interlayer insulating film 2260, the film is formed by plasma CVD in which TEOS and $O_2$ are mixed, the reaction pressure is set to 40 Pa, the substrate temperature is set to 300 to 400° C., and the high frequency (13.56 MHz) power density is set to 0.5 to 0.8 W/cm$^2$ for electric discharge. If a silicon oxynitride film is used for the first interlayer insulating film 2260, the film may be formed by plasma CVD from SiH$_4$, N$_2$O, and NH$_3$, or from SiH$_4$ and N$_2$O. The film formation conditions in this case include setting the reaction pressure to 20 to 200 Pa, the substrate temperature to 300 to 400° C., and the high frequency (60 MHz) power density to 0.1 to 1.0 W/cm. The first interlayer insulating film 2260 may be a silicon oxynitride hydrate film formed from SiH$_4$, N$_2$O, and H$_2$. A silicon nitride film as the first interlayer insulating film can be formed similarly by plasma CVD from SiH$_4$ and NH$_3$.

Then an activation step is conducted to activate the impurity elements that are used to dope the semiconductor layers in different concentrations and impart them the n type or p type conductivity (FIG. 21C). The conductive films used as the gate electrodes in this embodiment are easily oxidized and the resistivity thereof is raised as a result of oxidization. Accordingly, heat treatment for activation in this embodiment is conducted preferably under reduced pressure atmosphere by evacuation using a rotary pump or mechanical booster pump to reduce the oxygen concentration in the atmosphere.

Next, dangling bonds in the active layers are terminated through hydrogenation using thermally excited hydrogen. The hydrogenation is achieved by heat treatment in a hydrogen atmosphere at 41° C. for an hour. Other hydrogenation means include plasma hydrogenation that uses hydrogen excited by plasma.

Then, a second interlayer insulating film 2270 is formed to have a thickness of 500 to 1000 nm (800 nm, in this embodiment). The second interlayer insulating film 2270 may be an organic insulating film such as an acrylic film, a polyimide film, a polyamide film, or a BCB (benzocyclobutene) film, or an inorganic insulating film such as a silicon oxynitride film or a silicon nitride oxide film.

Thereafter, a resist mask of a given pattern is formed to form contact holes reaching the first impurity regions 2150 and 2170, the third impurity regions 2240 and 2250, and the impurity region 2090. The contact hole reaching the impurity region 2090 is omitted in FIG. 21D. The contact holes are formed by dry etching. In this case, a mixture of CF$_4$, O$_2$, and He is used as etching gas to etch the second interlayer insulating film 2270 first. The etching gas is then changed to a mixture of CF$_4$ and O$_2$ to etch the first interlayer insulating film 2260. The etching gas is further changed to CHF$_3$ in order to enhance the selective ratio with the semiconductor layers, and the gate insulating film 2050 is etched. Thus, the contact holes are formed.

A metal conductive film is formed by sputtering or vacuum evaporation and patterned using a mask. The film is then etched to form a source line 2280, connection wiring lines 2290 and 2300, a power supply line 2310, and a light reflector 2600. The source line 2280 is connected to the first impurity region 2150. The connection wiring line 2290 is connected to the first impurity region 2170. The connection wiring line 2300 is connected to the third impurity region 2200 and the power supply line 2310 is connected to the third impurity region 2250. Though not shown in FIG. 21D, the connection wiring line 2290 is connected to the gate electrode 2120. Though not shown in FIG. 21D, the power supply line 2310 is connected to the impurity region 2090.

The wiring lines in this embodiment are formed from a laminate of a Ti film with a thickness of 50 nm and an alloy film (Al—Ti alloy film) with a thickness of 500 nm, though not shown in FIG. 21D.

Figure 22:
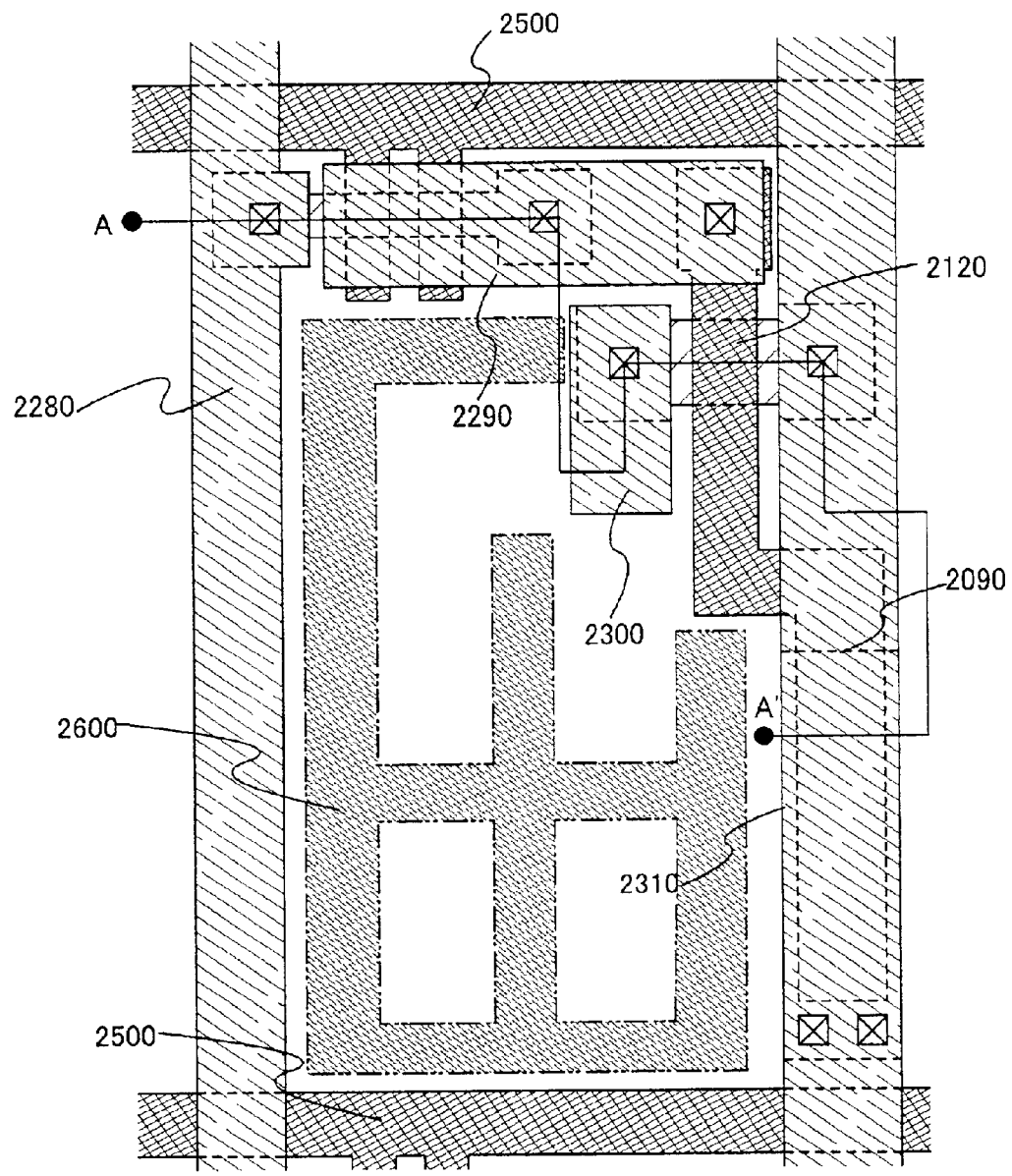
FIG. 22 is a diagram showing a process of manufacturing a light emitting device of the present invention.
Figure 23:
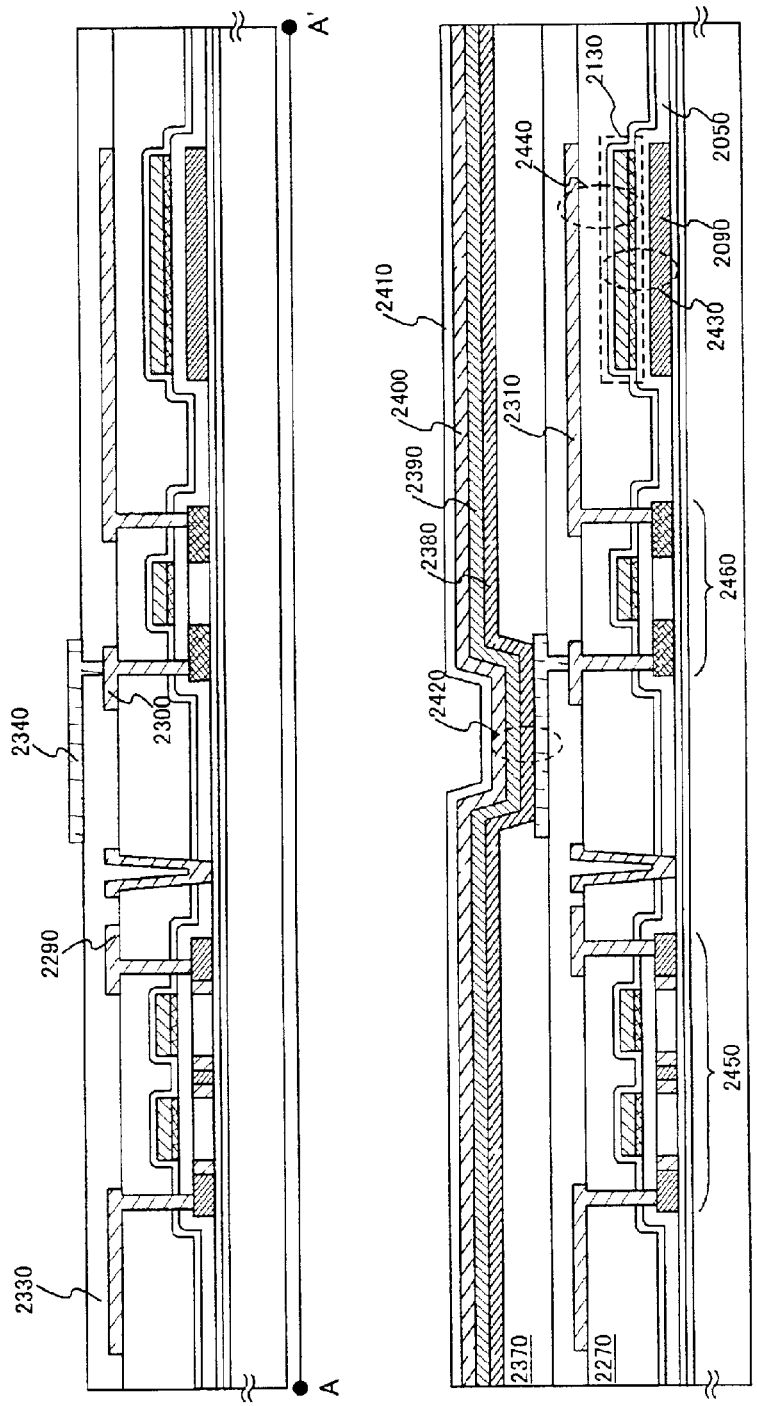
FIGS. 23A and 23B are diagrams showing a process of manufacturing a light emitting device of the present invention.

A top view of the pixel that has finished the step of FIG. 21D is shown in FIG. 22. FIG. 21D corresponds to the sectional view of the pixel taken along the line A–A' in FIG. 22. Note that the gate insulating film 2050 and the first and second interlayer insulating film 2260 and 2270 are omitted here for clearer view. Denoted by 2500 is a gate line.

A third interlayer insulating film 2330 is formed next. For the need of planarization, the third interlayer insulating film 2330 is formed from an organic insulating film such as a polyimide film or an acrylic film to have a thickness of 1.5 µm. A contact hole reaching the connection wiring line 2300 is formed in the third interlayer insulating film 2330. A transparent conductive film with a thickness of 80 to 120 nm is formed on the third interlayer insulating film 2330 and then patterned. Thus formed is a pixel electrode 2340 (FIG. 23A). The transparent conductive film used in this embodiment is an indium tin oxide (ITO) film or a film obtained by mixing 2 to 20% of zinc oxide (ZnO) with indium oxide.

Figure 24:
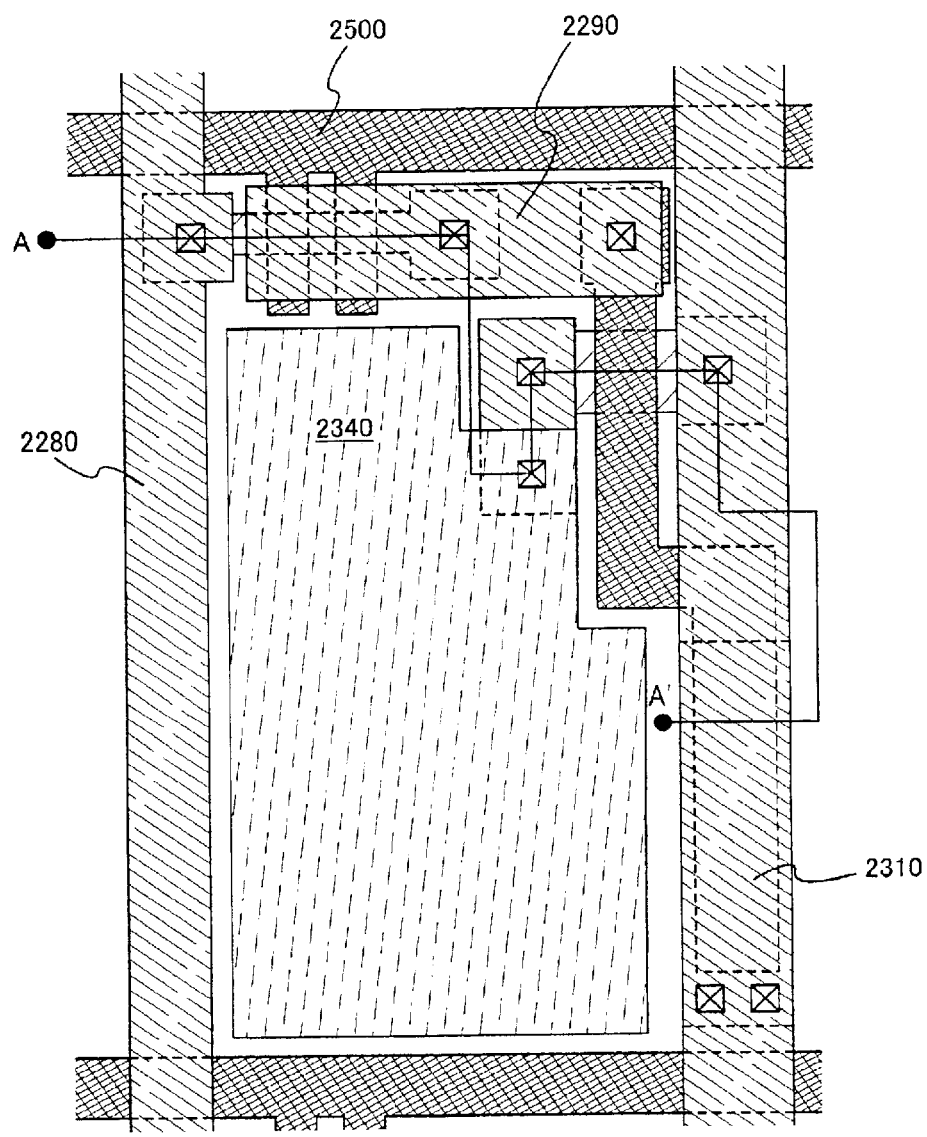
FIG. 24 is a diagram showing a process of manufacturing a light emitting device of the present invention.

A top view of the pixel that has finished the step of FIG. 23A is shown in FIG. 24. FIG. 23A corresponds to the sectional view of the pixel taken along the line A–A' in FIG. 24. Note that the third interlayer insulating film 2330 is omitted here for clearer view.

The source line and the power supply line are denoted by 2280 and 2310, respectively. As shown in FIG. 24, the connection wiring line 2290 in one pixel is connected to the connection wiring line 2290 of its adjacent pixel. Alternatively, adjacent pixels share one connection wiring line 2290. Every connection wiring line 2290 receives a given electric potential. Denoted by 2500 is the gate line that is connected to the gate electrode 2110.

Next, a fourth interlayer insulating film 2370 having an opening at the position that coincides with the pixel electrode 2340 is formed as shown in FIG. 23B. The fourth interlayer insulating film 2370 is capable of insulating, and functions as a bank to separate organic compound layers of adjacent pixels from one another. In this embodiment, a resist is used to form the fourth interlayer insulating film 2370.

An organic compound layer 2380 is then formed by evaporation. A cathode (MgAg electrode) 2390 and a protective electrode 2400 are also formed by evaporation. Desirably, heat treatment is conducted on the pixel electrode 2340 prior to formation of the organic compound layer 2380 and the cathode 2390, so that moisture contained is removed completely. Although a MgAg electrode is used for the cathode of the light emitting element in this embodiment, other known materials may be used instead.

A known material can be used for the organic compound layer 2380. The organic compound layer in this embodiment has a two-layer structure consisting of a hole transporting layer and an organic compound layer. The organic compound layer may additionally have one or some of a hole injection layer, an electron injection layer, and an electron transporting layer. Various combinations have been reported and the organic compound layer of this embodiment can take any of those.

The hole transporting layer of this embodiment is formed by evaporation from polyphenylene vinylene. The organic compound layer of this embodiment is formed by evaporation from polyvinyl carbazole with 30 to 40% of PBD, that is a 1,3,4-oxadiazole derivative, being molecule-dispersed. The organic compound layer is doped with about 1% of Coumarin 6 as green luminescent center.

The protective electrode 2400 alone can protect the organic compound layer 2380 from moisture and oxygen, but it is more desirable to use a protective film 2410. This embodiment uses a silicon nitride film with a thickness of 300 nm as the protective film 2410. The protective electrode 2400 and the protective film may be formed in succession without exposing the device to the air.

The protective electrode 2400 also prevents degradation of the cathode 2390. A typical material of the protective electrode is a metal film mainly containing aluminum. Other materials may of course be used. Since the organic compound layer 2380 and the cathode 2390 are extremely weak against moisture, the organic compound layer 2380, the cathode 2390, and the protective electrode 2400 are desirably formed in succession without exposing them to the air. The organic compound layer and the cathode are thus protected from the outside air.

The organic compound layer 2380 is 10 to 400 nm in thickness (typically 60 to 150 nm), and the cathode 2390 is 80 to 200 nm in thickness (typically 100 to 150 nm).

Thus completed is a light emitting device structured as shown in FIG. 23B. An area 2420 where the pixel electrode 2340, the organic compound layer 2380, and the cathode 2390 overlap corresponds to the light emitting element.

In this embodiment, a capacitor storage 2430 is formed from the impurity region 2090, the gate insulating film 2050, and the capacitance electrode 2130. A capacitor storage 2440 is formed from the capacitance electrode 2130, the second interlayer insulating film 2270, and the power supply line 2310. The impurity region 2090 and the capacitance electrode 2130 overlap the power supply line 2310 and, therefore, the capacitor storages 2430 and 2440 can be formed without lowering the aperture ratio.

Denoted by 2450 and 2460 are a switching TFT and a driving TFT, respectively.

In practice, the device that has reached the stage of FIG. 23B is preferably packaged (sealed) to further avoid exposure to the outside air. For packaging, a protective film which is highly airtight and which allows little gas to leak (such as a laminate film or a UV-curable resin film) or a light-transmissive sealing member can be used. The reliability of the light emitting element is improved if the interior of the sealing member has an inert atmosphere or a hygroscopic material (barium oxide, for example) is placed inside.

The light emitting device of the present invention can be made by other methods than the manufacture method described in this embodiment. A known method can be used to manufacture the light emitting device of the present invention.

This embodiment may be combined freely with Embodiment Modes 1 through 6 and Embodiments 1 through 4.

Embodiment 5

Figure 25A:
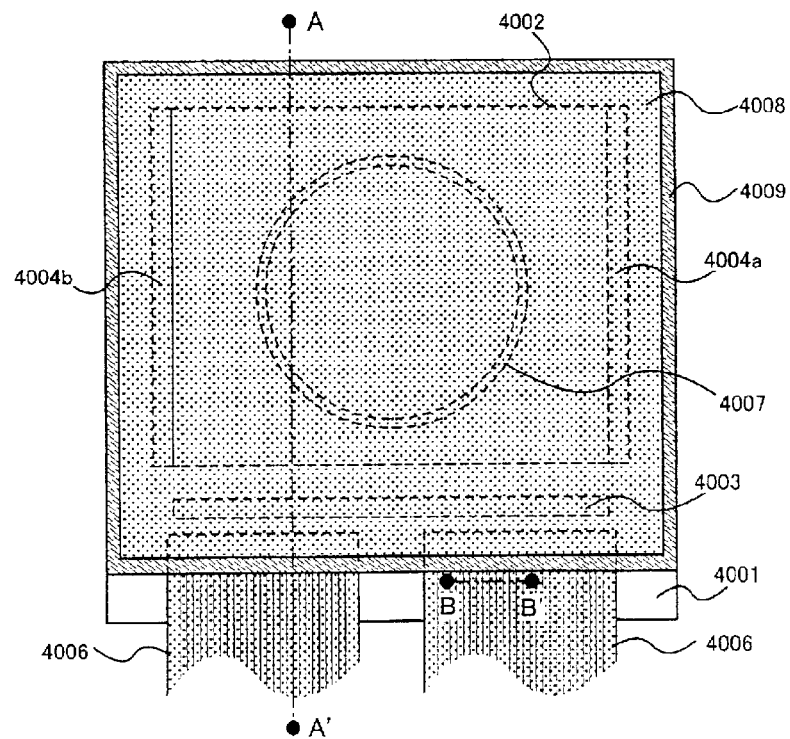
FIGS. 25A to 25C are diagrams of a light emitting device of the present invention, with FIG. 25A showing a top view thereof and FIGS. 25B and 25C showing sectional views thereof.
Figure 25B:
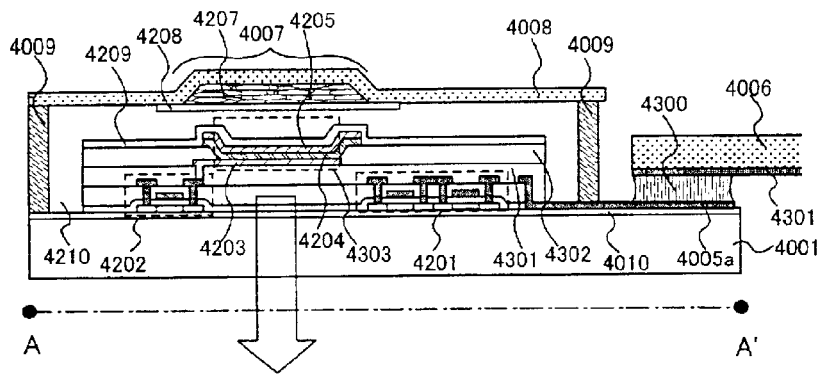
Figure 25C:
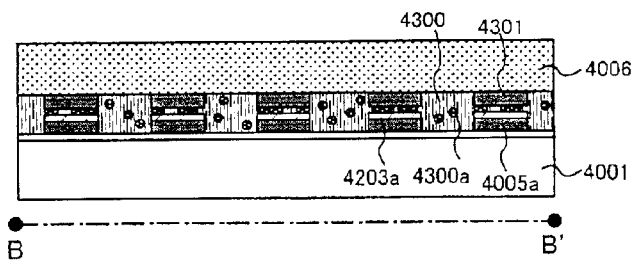

This embodiment describes with reference to FIGS. 25A to 25C a case of manufacturing a light emitting device using the present invention.

FIG. 25A is a top view of a light emitting device in which a substrate with a light emitting element formed thereon is sealed by a sealing member. FIG. 25B is a sectional view taken along the line A–A' in FIG. 25A. FIG. 25C is a sectional view taken along the line B–B' in FIG. 25A.

A pixel portion 4002, a source line driving circuit 4003, and first and second gate line driving circuits 4004a and 4004b are formed on a substrate 4001. A seal member 4009 is placed so as to surround them all on the substrate. A sealing member 4008 is provided on the pixel portion 4002, the source line driving circuit 4003, and the first and second gate line driving circuits 4004a and 4004b. Accordingly, the pixel portion 4002, the source line driving circuit 4003, and the first and second gate line driving circuits 4004a and 4004b are sealed in the space defined by the substrate 4001, the seal member 4009, and the sealing member 4008, with a filler 4210 filling the space.

The pixel portion 4002, the source line driving circuit 4003, and the first and second gate line driving circuits 4004a and 4004b on the substrate 4001 each have a plurality of TFTs. The source line driving circuit 4003 is a circuit for inputting video signals to source lines. The first and second gate line driving circuits 4004a and 4004b are circuits for selecting a gate line in response to a selection signal.

FIG. 25B shows, as representatives of those TFTs, a driving circuit TFT (composed of an n-channel TFT and a p-channel TFT in FIG. 25B) 4201 included in the source line driving circuit 4003 and a driving TFT (a TFT for controlling a current flowing into the light emitting element) 4202 included in the pixel portion 4002.

In this embodiment, the n-channel TFT or the p-channel TFT that constitutes the driving circuit TFT 4201 is manufactured by a known method, and a p-channel TFT manufactured by a known method is used for the driving TFT 4202. The pixel portion 4002 is provided with a capacitor storage (not shown) connected to a gate of the driving TFT 4202.

Formed on the driving circuit TFT 4201 and the driving TFT 4202 is an interlayer insulating film (planarization film) 4301, on which a pixel electrode (anode) 4203 is formed to be electrically connected to a drain of the driving TFT 4202. The pixel electrode 4203 is formed of a transparent conductive film having a large work function. Examples of the usable transparent conductive film material include a compound of indium oxide and tin oxide, a compound of indium oxide and zinc oxide, zinc oxide alone, tin oxide alone, and indium oxide alone. A transparent conductive film formed of one of these materials and doped with gallium may also be used for the transparent conductive film.

An insulating film 4302 is formed on the pixel electrode 4203. An opening is formed in the insulating film 4302 above the pixel electrode 4203. At the opening above the pixel electrode 4203, an organic compound layer 4204 is formed. The organic compound layer 4204 is formed of a known organic light emitting material or inorganic light emitting material. Either low molecular weight (monomer) organic light emitting materials or high molecular weight (polymer) organic light emitting materials can be used for the organic light emitting layer.

The organic compound layer 4204 is formed by a known evaporation technique or application technique. The organic compound layer may consist solely of a light emitting layer. Alternatively, the organic compound layer may be a laminate having, in addition to an organic compound layer, a hole injection layer, a hole transporting layer, an electron transporting layer, and an electron injection layer in any combination.

A cathode 4205 is formed on the organic compound layer 4204 from a light-shielding conductive film (typically, a conductive film mainly containing aluminum, copper, or silver, or a laminate consisting of the above conductive film and other conductive films). Desirably, moisture and oxygen are removed as much as possible from the interface between the cathode 4205 and the organic compound layer 4204. For example, the organic compound layer 4204 is formed in a nitrogen or rare gas atmosphere and then the cathode 4205 is successively formed without exposing the substrate to moisture and oxygen. This embodiment uses a multi-chamber system (cluster tool system) film formation apparatus to achieve the film formation described above. The cathode 4205 receives a given voltage.

A light emitting element 4303 composed of the pixel electrode (anode) 4203, the organic compound layer 4204, and the cathode 4205 is thus formed. A protective film 4209 is formed on the insulating film 4302 so as to cover the light emitting element 4303. The protective film 4209 is effective in preventing oxygen and moisture from entering the light emitting element 4303.

Denoted by 4005$a$ is a lead-out wiring line connected to a power supply line, and is electrically connected to a source region of the driving TFT 4202. The lead-out wiring line 4005$a$ runs between the seal member 4009 and the substrate 4001 and is electrically connected to an FPC wiring line 4301 of an FPC 4006 through an anisotropic conductive film 4300.

The sealing member 4008 is formed of a glass material, a metal material (typically a stainless steel material), a ceramic material, or a plastic material (including a plastic film). Examples of the usable plastic material include an FRP (fiberglass-reinforced plastic) plate, a PVF (polyvinyl fluoride) film, a Mylar film, a polyester film, and an acrylic resin film. A sheet obtained by sandwiching an aluminum foil between PVF films or Mylar films may also be used.

However, if light emitted from the light emitting element travels toward the cover member, the cover member has to be transparent. In this case, a transparent material such as a glass plate, a plastic plate, a polyester film, or an acrylic film is used.

The filler 4210 may be inert gas such as nitrogen and argon, or a UV-curable resin or a thermally curable resin. Examples thereof include PVC (polyvinyl chloride), acrylic, polyimide, an epoxy resin, a silicone resin, PVB (polyvinyl butyral), and EVA (ethylene vinyl acetate). In this embodiment, nitrogen is used as the filler.

In order to expose the filler 4210 to a hygroscopic substance (preferably barium oxide) or a substance capable of adsorbing oxygen, a hygroscopic substance 4207, or a substance 4207 capable of adsorbing oxygen, is placed in a concave portion 4007 formed on a surface of the sealing member 4008 on the substrate 4001 side. The hygroscopic substance 4207, or a substance 4207 capable of adsorbing oxygen, is held down to the concave portion 4007 by a concave portion covering member 4208 to prevent hygroscopic substance 4207, or a substance 4207 capable of adsorbing oxygen, from scattering. The concave portion covering member 4208 is a dense mesh and allows air and moisture to pass but not the hygroscopic substance 4207, or a substance 4207 capable of adsorbing oxygen. The hygroscopic substance 4207, or a substance 4207 capable of adsorbing oxygen, can prevent degradation of the light emitting element 4303.

As shown in FIG. 25C, a conductive film 4203$a$ is formed to be brought into contact with the top face of the lead-out wiring line 4005$a$ at the same time the pixel electrode 4203 is formed.

The anisotropic conductive film 4300 has a conductive filler 4300$a$. The conductive filler 4300$a$ electrically connects the conductive film 4203$a$ on the substrate 4001 to the FPC wiring line 4301 on the FPC 4006 upon thermal press fitting of the substrate 4001 and the FPC 4006.

This embodiment may be combined freely with Embodiment Modes 1 through 6 and Embodiments 1 to 5.

Embodiment 6

The light emitting device is of the self-emission type, and thus exhibits more excellent recognizability of the displayed image in a light place as compared to the liquid crystal display device. Furthermore, the light emitting device has a wider viewing angle. Accordingly, the light emitting device can be applied to a display portion in various electronic devices.

Such electronic devices using a light emitting device of the present invention include a video camera, a digital camera, a goggles-type display (head mount display), a navigation system, a sound reproduction device (a car audio equipment and an audio set), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the light emitting device is preferable, since the portable information terminal that is likely to be viewed from a tilted direction is often required to have a wide viewing angle. FIG. 26 respectively shows various specific examples of such electronic devices.

Figure 26A:
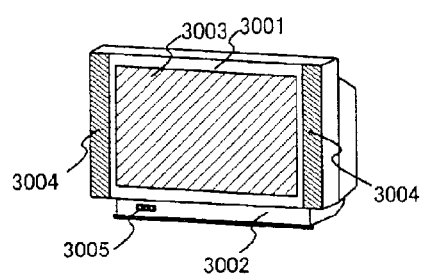
FIGS. 26A to 26H are diagrams showing electronic equipment using a light emitting device of the present invention.

FIG. 26A illustrates a light emitting display device which includes a casing 3001, a support table 3002, a display portion 3003, a speaker portion 3004, a video input terminal 3005 or the like. The present invention is applicable to the display portion 3003. The light emitting device is of the self-emission type and therefore requires no back light. Thus, the display portion thereof can have a thickness thinner than that of the liquid crystal display device. The light emitting display device is including all of the display device for displaying information, such as a personal computer, a receiver of TV broadcasting and an advertising display.

Figure 26B:
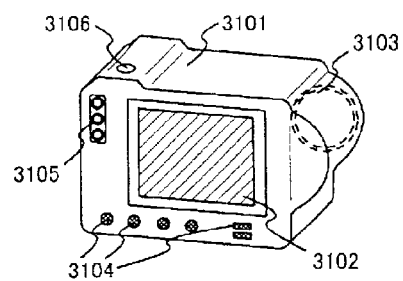

FIG. 26B illustrated a digital still camera which includes a main body 3101, a display portion 3102, an image receiving portion 3103, an operation key 3104, an external connection port 3105, a shutter 3106, or the like. The light emitting device in accordance with the present invention can be used as the display portion 3102.

Figure 26C:
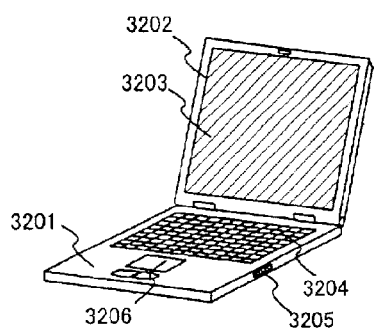

FIG. 26C illustrates a laptop computer which includes a main body 3201, a casing 3202, a display portion 3203, a keyboard 3204, an external connection port 3205, a pointing mouse 3206, or the like. The light emitting device in accordance with the present invention can be used as the display portion 3203.

Figure 26D:
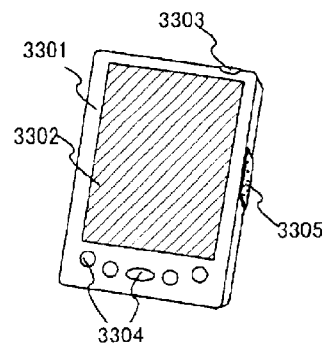

FIG. 26D illustrated a mobile computer which includes a main body 3301, a display portion 3302, a switch 3303, an operation key 3304, an infrared port 3305, or the like. The light emitting device in accordance with the present invention can be used as the display portion 3302.

Figure 26E:
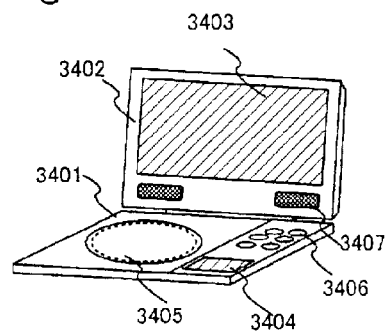

FIG. 26E illustrates an image reproduction apparatus including a recording medium (more specifically, a DVD reproduction apparatus), which includes a main body 3401, a casing 3402, a display portion A 3403, another display portion B 3404, a recording medium (DVD or the like) reading portion 3405, an operation key 3406, a speaker portion 3407 or the like. The display portion A 3403 is used mainly for displaying image information, while the display portion B 3404 is used mainly for displaying character information. The light emitting device in accordance with the present invention can be used as these display portions A and B. The image reproduction apparatus including a recording medium further includes a game machine or the like.

Figure 26F:
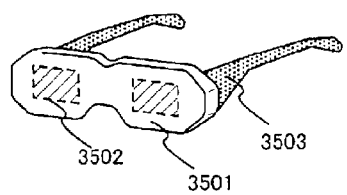

FIG. 26F illustrates a goggle type display (head mounted display) which includes a main body 3501, a display portion 3502, an arm portion 3503. The light emitting device in accordance with the present invention can be used as the display portion 3502.

Figure 26G:
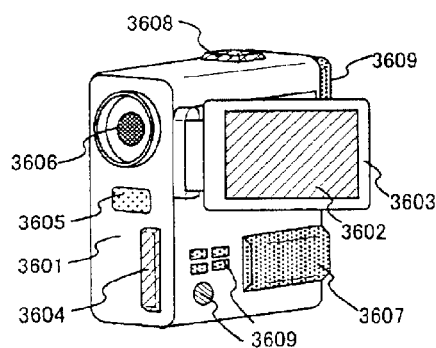

FIG. 26G illustrates a video camera which includes a main body 3601, a display portion 3602, a casing 3603, an external connecting port 3604, a remote control receiving portion 3605, an image receiving portion 3606, a battery 3607, a sound input portion 3608, an operation key 3609, or the like. The light emitting device in accordance with the present invention can be used as the display portion 3602.

Figure 26H:
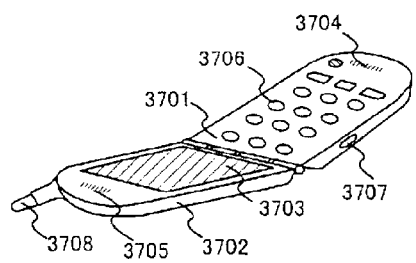

FIG. 26H illustrates a mobile phone which includes a main body 3701, a casing 3702, a display portion 3703, a sound input portion 3704, a sound output portion 3705, an operation key 3706, an external connecting port 3707, an antenna 3708, or the like. The light emitting device in accordance with the present invention can be used as the display portion 3703. Note that the display portion 3703 can reduce power consumption of the portable telephone by displaying white-colored characters on a black-colored background.

When the brighter luminance of light emitted from the organic light emitting material becomes available in the future, the light emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light emitting device is suitable for displaying moving pictures since the organic light emitting material can exhibit high response speed.

A portion of the light emitting device that is emitting light consumes power, so it is desirable to display information in such a manner that the light emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light emitting portion while a non-emission portion corresponds to the background.

As set forth above, the present invention can be applied variously to a wide range of electronic devices in all fields. The electronic device in this embodiment can be obtained by utilizing a light emitting device having the configuration in which the structures in Embodiment Mode and Embodiments 1 through 5 are freely combined.

The efficiency in taking out light emitted from an organic compound layer is improved by providing a light emitting device with a light reflector of the present invention. Moreover, this light emitting device can have higher luminance when consuming the same amount of power as a conventional light emitting device. Or, to put it the other way, this light emitting device can obtain the same level of luminance as a conventional light emitting device with less power consumption.

What is claimed is:

1. A light emitting device comprising:
   an insulating film formed over an insulating surface;
   a light emitting element comprising a transparent electrode, an organic compound layer formed on the transparent electrode and a cathode formed on the organic compound layer, formed over the insulating film,
   wherein a hole is formed in the insulating film,
   wherein a light reflector is placed so as to cover the hole, and
   wherein the light reflector is directly in contact with the insulating surface.

2. A light emitting device according to claim 1, wherein the light reflector is a metal film.

3. A light emitting device according to claim 1, wherein the taper angle ($\theta b$) of the light reflector and the critical angle ($\theta f$) at the interface between the light emitting device and the air satisfy $\theta b < (45° + \theta f/2)$.

4. A light emitting device according to claim 1, wherein the maximum distance (L) from the organic compound layer to the light reflector, the maximum thickness (D) from the organic compound layer to the light reflector, and the critical angle ($\theta f$) at the interface between the light emitting device and the air satisfy $L/D < \tan \theta f$.

5. A light emitting device according to claim 1, wherein the hole is placed so as not to overlap the light emitting element.

6. A light emitting device according to claim 1,
   wherein first and second wiring lines are provided on the insulating surface, and
   wherein the hole is placed in a region surrounded by the first and second wiring lines.

7. A light emitting device according to claim 6, wherein each of the first and second wiring lines is one selected from the group consisting of a source line, a gate line, a power supply line, a capacitance line, and a reset line.

8. A light emitting device according to claim 1, wherein an electronic equipment comprising the light emitting device is selected from the group of a light emitting display device, a digital still camera, a lap top computer, a mobile computer, a DVD player, goggle type display, a video camera and a mobile phone.

9. A light emitting device comprising:
   at least one transistor formed over an insulate surface;
   an insulating film formed in contact with the transistor; and
   a light emitting element comprising a transparent electrode, an organic compound layer formed on the transparent electrode and a cathode formed on the organic compound layer, formed in contact with the insulating film,
   wherein a hole is formed in the insulating film,
   wherein a light reflector is placed so as to cover the hole, and
   wherein the light reflector is not in contact with the at least one transistor.

10. A light emitting device according to claim 9, wherein the light reflector is a metal film.

11. A light emitting device according to claim 9, wherein the taper angle ($\theta$b) of the light reflector and the critical angle ($\theta$f) at the interface between the light emitting device and the air satisfy $\theta b < (45° + \theta f/2)$.

12. A light emitting device according to claim 9, wherein the maximum distance (L) from the organic compound layer to the light reflector, the maximum thickness (D) from the organic compound layer to the light reflector, and the critical angle ($\theta$f) at the interface between the light emitting device and the air satisfy $L/D < \tan \theta f$.

13. A light emitting device according to claim 9, wherein the hole is placed so as not to overlap the light emitting element.

14. A light emitting device according to claim 9,
    wherein first and second wiring lines are provided on the insulating surface, and
    wherein the hole is placed in a region surrounded by the first and second wiring lines.

15. A light emitting device according to claim 14, wherein each of the first and second wiring lines is one selected from the group consisting of a source line, a gate line, a power supply line, a capacitance line, and a reset line.

16. A light emitting device according to claim 9, wherein an electronic equipment comprising the light emitting device is selected from the group of a light emitting display device, a digital still camera, a lap top computer, a mobile computer, a DVD player, goggle type display, a video camera and a mobile phone.

17. A light emitting device comprising:
    at least one transistor formed over an insulating surface;
    an insulating film formed in contact with the transistor; and
    a light emitting element comprising a transparent electrode, an organic compound layer formed on the transparent electrode and a cathode formed on the organic compound layer, formed in contact with the insulating film,
    wherein a hole is formed in the insulating film,
    wherein the cathode is placed so as to cover the hole, and
    wherein the cathode is not in contact with the at least one transistor.

18. A light emitting device according to claim 17, wherein the taper angle ($\theta$b) of the cathode formed so as to cover the hole and the critical angle ($\theta$f) at the interface between the light emitting device and the air satisfy $\theta b < (45° + \theta f/2)$.

19. A light emitting device according to claim 17, wherein the maximum distance (L) from the organic compound layer to the cathode formed so as to cover the hole, the maximum thickness (D) from the organic compound layer to the cathode, and the critical angle ($\theta$f) at the interface between the light emitting device and the air satisfy $L/D < \tan \theta f$.

20. A light emitting device according to claim 3, wherein the hole is placed so as not to overlap the light emitting element.

21. A light emitting device according to claim 17,
    wherein first and second wiring lines are provided on the insulating surface, and
    wherein the hole is placed in a region surrounded by the first and second wiring lines.

22. A light emitting device according to claim 21, wherein each of the first and second wiring lines is one selected from the group consisting of a source line, a gate line, a power supply line, a capacitance line, and a reset line.

23. A light emitting device according to claim 17, wherein an electronic equipment comprising the light emitting device is selected from the group of a light emitting display device, a digital still camera, a lap top computer, a mobile computer, a DVD player, goggle type display, a video camera and a mobile phone.

24. A light emitting device comprising:
    at least one transistor formed over the insulating surface;
    a first insulating film formed in contact with the transistor;
    a second insulating film formed in contact with the first insulating film;
    a light emitting element comprising a transparent electrode, an organic compound layer formed on the transparent electrode and a cathode formed on the organic compound layer, formed in contact with the insulating film,
    wherein a hole is formed in the first and second insulating films,
    wherein a light reflector is placed so as to cover the hole, and
    wherein the light reflector is directly is contact with the insulating surface.

25. A light emitting device according to claim 24, wherein the light reflector is a metal film.

26. A light emitting device according to claim 24, wherein the taper angle ($\theta$b) of the light reflector and the critical angle ($\theta$f) at the interface between the light emitting device and the air satisfy $\theta b < (45° + \theta f/2)$.

27. A light emitting device according to claim 24, wherein the maximum distance (L) from the organic compound layer to the light reflector, the maximum thickness (D) from the organic compound layer to the light reflector, and the critical angle ($\theta$f) at the interface between the light emitting device and the air satisfy $L/D < \tan \theta f$.

28. A light emitting device according to claim 24, wherein the hole is placed so as not to overlap the light emitting element.

29. A light emitting device according to claim 24,
    wherein first and second wiring lines are provided on the insulating surface, and
    wherein the hole is placed in a region surrounded by the first and second wiring lines.

30. A light emitting device according to claim 29, wherein each of the first and second wiring lines is one selected from the group consisting of a source line, a gate line, a power supply line, a capacitance line, and a reset line.

31. A light emitting device according to claim 24, wherein the hole formed in the first insulating film and the hole formed in the second insulating film overlap each other.

32. A light emitting device according to claim 24, wherein an electronic equipment comprising the light emitting device is selected from the group of a light emitting display device, a digital still camera, a lap top computer, a mobile computer, a DVD player, goggle type display, a video camera and a mobile phone.

33. A light emitting device comprising:
    at least one transistor formed over an insulating surface;
    a first insulating film formed in contact with the transistor;
    a second insulating film formed in contact with the first insulating film; and
    a light emitting element comprising a transparent electrode, an organic compound layer formed on the transparent electrode and a cathode formed on the organic compound layer, formed in contact with the insulating film,
    wherein a hole is formed in the first and second insulating films,
    wherein the cathode is placed so as to cover the hole, and
    wherein the cathode is not in contact with the at least one transistor.

34. A light emitting device according to claim 33, wherein the taper angle ($\theta b$) of the cathode formed so as to cover the hole and the critical angle ($\theta f$) at the interface between the light emitting device and the air satisfy $\theta b<(45°+\theta f/2)$.

35. A light emitting device according to claim 33, wherein the maximum distance (L) from the organic compound layer to the cathode formed so as to cover the hole, the maximum thickness (D) from the organic compound layer to the cathode, and the critical angle ($\theta f$) at the interface between the light emitting device and the air satisfy $L/D<\tan \theta f$.

36. A light emitting device according to claim 33, wherein the hole is placed so as not to overlap the light emitting element.

37. A light emitting device according to claim 33,
    wherein first and second wiring lines are provided on the insulating surface, and
    wherein the hole is placed in a region surrounded by the first and second wiring lines.

38. A light emitting device according to claim 37, wherein each of the first and second wiring lines is one selected from the group consisting of a source line, a gate line, a power supply line, a capacitance line, and a reset line.

39. A light emitting device according to claim 33, wherein the hole formed in the first insulating film and the hole formed in the second insulating film overlap each other.

40. A light emitting device according to claim 33, wherein an electronic equipment comprising the light emitting device is selected from the group of a light emitting display device, a digital still camera, a lap top computer, a mobile computer, a DVD player, goggle type display, a video camera and a mobile phone.

41. A light emitting device comprising:
    at least one transistor formed over an insulating surface;
    a first insulating film formed in contact with the transistor;
    a second insulating film formed in contact with the first insulating film;
    a third insulating film formed in contact with the second insulating film; and
    a light emitting element comprising a transparent electrode, an organic compound layer formed on the transparent electrode and a cathode formed on the organic compound layer, formed in contact with the insulating film,
    wherein a hole is formed in the first, second and third insulating films,
    wherein a light reflector is placed so as to cover the hole, and
    wherein the light reflector is directly in contact with the insulating surface.

42. A light emitting device according to claim 41, wherein the light reflector is a metal film.

43. A light emitting device according to claim 41, wherein the taper angle ($\theta b$) of the light reflector and the critical angle ($\theta f$) at the interface between the light emitting device and the air satisfy $\theta b<(45°+\theta f/2)$.

44. A light emitting device according to claim 41, wherein the maximum distance (L) from the organic compound layer to the light reflector, the maximum thickness (D) from the organic compound layer to the light reflector, and the critical angle ($\theta f$) at the interface between the light emitting device and the air satisfy $L/D<\tan \theta f$.

45. A light emitting device according to claim 41, wherein the hole is placed so as not to overlap the light emitting element.

46. A light emitting device according to claim 41,
    wherein first and second wiring lines are provided on the insulating surface, and
    wherein the hole is placed in a region surrounded by the first and second wiring lines.

47. A light emitting device according to claim 46, wherein each of the first and second wiring lines is one selected from the group consisting of a source line, a gate line, a power supply line, a capacitance line, and a reset line.

48. A light emitting device according to claim 41, wherein the hole formed in the first insulating film, the hole formed in the second insulating film, and the hole formed in the third insulating film overlap one another.

49. A light emitting device according to claim 41, wherein an electronic equipment comprising the light emitting device is selected from the group of a light emitting display device, a digital still camera, a lap top computer, a mobile computer, a DVD player, goggle type display, a video camera and a mobile phone.

50. A light emitting device comprising:
    at least one transistor formed over an insulating surface;
    a first insulating film formed in contact with the transistor;
    a second insulating film formed in contact with the first insulating film;
    a third insulating film formed in contact with the second insulating film; and
    a light emitting element comprising a transparent electrode, an organic compound layer formed on the transparent electrode and a cathode formed on the organic compound layer, formed in contact with the insulating film,
    wherein a hole is formed in the first to third insulating films,
    wherein the cathode is placed so as to cover the hole, and
    wherein the cathode is not in contact with the at least one transistor.

51. A light emitting device according to claim 50, wherein the taper angle ($\theta b$) of the cathode formed so as to cover the hole and the critical angle ($\theta f$) at the interface between the light emitting device and the air satisfy $\theta b<(45°+\theta f/2)$.

52. A light emitting device according to claim 50, wherein the maximum distance (L) from the organic compound layer to the cathode formed so as to cover the hole, the maximum thickness (D) from the organic compound layer to the cathode, and the critical angle ($\theta f$) at the interface between the light emitting device and the air satisfy $L/D<\tan \theta f$.

53. A light emitting device according to claim 50, wherein the hole is placed so as not to overlap the light emitting element.

54. A light emitting device according to claim 50,
wherein first and second wiring lines are provided on the insulating surface, and
wherein the hole is placed in a region surrounded by the first and second wiring lines.

55. A light emitting device according to claim 54, wherein each of the first and second wiring lines is one selected from the group consisting of a source line, a gate line, a power supply line, a capacitance line, and a reset line.

56. A light emitting device according to claim 50, wherein the hole formed in the first insulating film, the hole formed in the second insulating film, and the hole formed in the third insulating film overlap one another.

57. A light emitting device according to claim 50, wherein an electronic equipment comprising the light emitting device is selected from the group of a light emitting display device, a digital still camera, a lap top computer, a mobile computer, a DVD player, goggle type display, a video camera and a mobile phone.

* * * * *